(12) United States Patent
Okayasu et al.

(10) Patent No.: US 6,420,921 B1
(45) Date of Patent: Jul. 16, 2002

(54) DELAY SIGNAL GENERATING APPARATUS AND SEMICONDUCTOR TEST APPARATUS

(75) Inventors: Toshiyuki Okayasu; Hiroshi Tsukahara, both of Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/571,556

(22) Filed: May 16, 2000

(30) Foreign Application Priority Data

May 17, 1999 (JP) ............................................. 11-136191

(51) Int. Cl.[7] .............................................. H03H 11/26
(52) U.S. Cl. ......................................... 327/276; 327/235
(58) Field of Search ................................ 327/231, 232, 327/233, 234, 235, 237, 251, 253, 258, 261, 269, 270, 271, 276, 277, 284; 324/765, 76.35, 76.41, 76.52, 76.54, 76.77

(56) References Cited

U.S. PATENT DOCUMENTS

| 4,317,119 A | * | 2/1982 | Alvarez ...................... 342/455 |
| 4,939,677 A | | 7/1990 | Otuji et al. .................. 102/125 |
| 5,111,086 A | | 5/1992 | Back ........................... 327/261 |
| 5,719,515 A | * | 2/1998 | Danger ........................ 327/270 |
| 5,796,748 A | * | 8/1998 | Housako et al. ............. 714/720 |
| 6,138,259 A | * | 10/2000 | Tsuto .......................... 714/738 |

FOREIGN PATENT DOCUMENTS

| DE | 36 23 051 A1 | 1/1987 |
| DE | 38 43 261 A1 | 6/1990 |
| DE | 694 08 763 T2 | 6/1998 |
| EP | 0 456 231 A1 | 11/1991 |

OTHER PUBLICATIONS

Patent Abstracts of Japan; Publication No. 63005615 A; Jan. 1, 1998; 1 page.

* cited by examiner

Primary Examiner—Toan Tran
Assistant Examiner—Cassandra Cox
(74) Attorney, Agent, or Firm—Rosenthal & Osha L.L.P.

(57) ABSTRACT

The delay signal generating apparatus according to the present invention for outputting a delay signal obtained by delaying a reference signal includes: a phase shift device capable of outputting a plurality of shift signals having phases shifted from a phase of the reference signal by different shift amounts, respectively; and a shift signal selector capable of selecting one of the shift signals that has a phase shifted by a predetermined shift amount and outputting the selected shift signal.

16 Claims, 20 Drawing Sheets

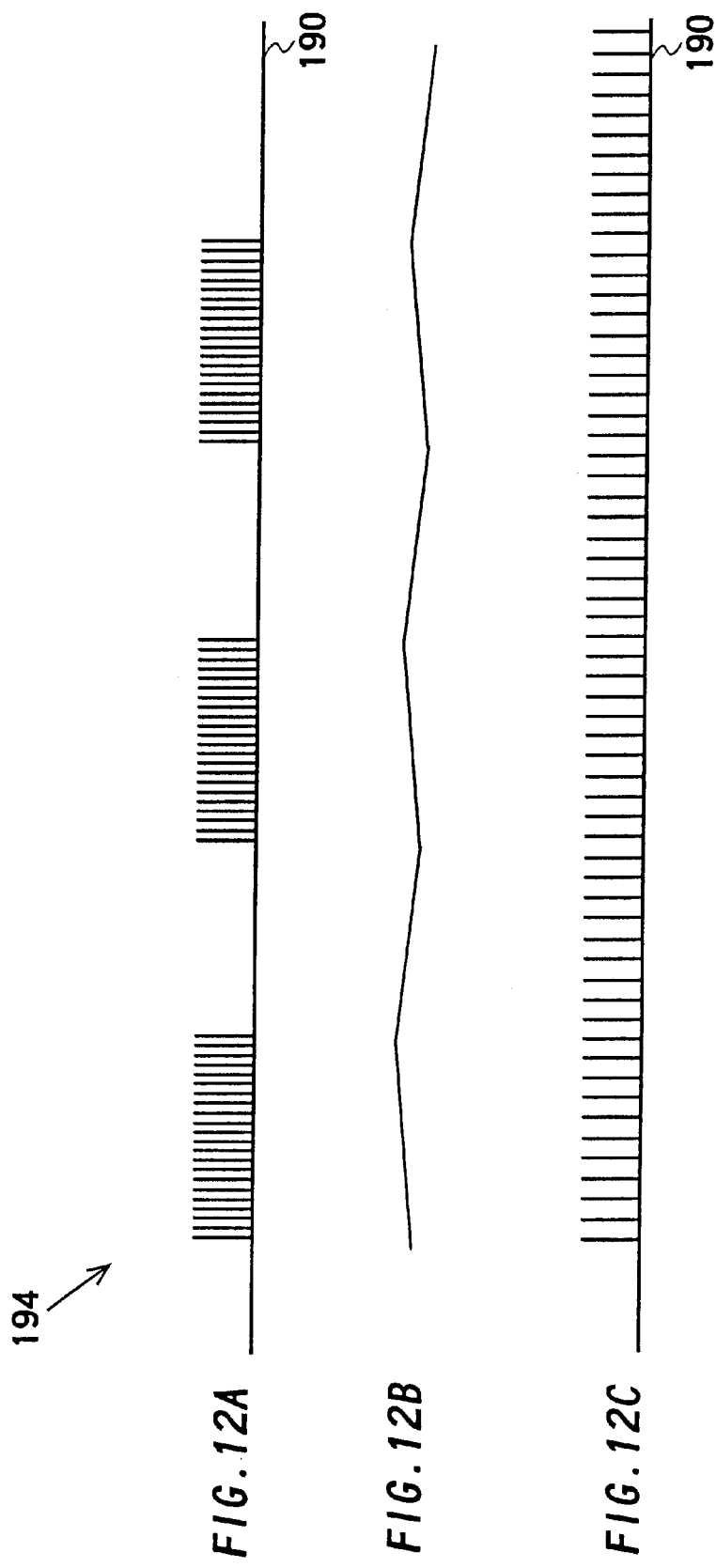

*FIG.13*

DELAY SIGNAL GENERATING APPARATUS AND SEMICONDUCTOR TEST APPARATUS

This patent application claims priority based on a Japanese patent application, H11-136191 filed on May 17, 1999, the contents of which are incorporated herein by reference.

BACKGROUND OF THE INVENTION

1. Field of the Invention

The present invention relates to a delay signal generating apparatus for generating a delay signal, and, in particular, to a delay signal generating apparatus used in a semiconductor testing apparatus.

2. Description of the Related Art

Development of semiconductor devices that can operate at high speed has recently flourished. This requires a semiconductor testing apparatus for testing such high-speed devices to have an ability to precisely control operation times. It is especially necessary to precisely delay a time at which an input pattern signal is input to a device to be tested with respect to a reference signal, depending on the input characteristics of the device to be tested.

FIG. 1 is a block diagram schematically showing a conventional variable delay circuit 10 that delays a reference signal 54 in order to generate a delay signal 74 having a predetermined delay time. The variable delay circuit 10 includes a minute variable delay portion 12, a gate stage number change portion 14, a linearizing memory 16, an input terminal 18 and an output terminal 20. The minute variable delay portion 12 includes a plurality of minute variable delay cells 12a, 12b, . . . , 12n. The gate stage number change portion 14 includes a plurality of variable delay elements 14a, 14b, 14c, . . . , 14m respectively having delay levels that change in a step-by-step manner. Each of the variable delay elements 14a, 14b, 14c, . . . , 14m has a gate circuit with one or more stages and a selector. In the conventional variable delay circuit 10, the reference signal 54 is input via the input terminal 18, and the delay signal 74 is output via the output terminal 20, after being delayed by a predetermined time period.

The gate stage number change portion 14 can change the delay time period by changing the number of gates through which the signal passes. Each of the variable delay elements 14a, 14b, 14c, . . . , 14m typically has resolution that is set for a delay of 200 (ps) or more. The minute variable delay portion 12 obtains a delay-setting resolution that is smaller than the delay time period of a single stage of a gate.

The linearizing memory 16 stores delay data that is combinations of delay elements that can realize predetermined delay times (delay time periods), respectively, in predetermined addresses therein. In the case of using one or some of the minute variable delay cells 12a, 12b, . . . , 12n and variable delay elements 14a, 14b, 14c, . . . , 14m for obtaining a certain delay time period, for example, corresponding bits of the linearizing memory 16 are set to "1". Other bits, each corresponding to the minute variable delay cell or variable delay element are set to "0". Each of the minute variable delay cells 12a, 12b, . . . , 12n and variable delay elements 14a, 14b, 14c, . . . , 14m selects whether to delay a signal input thereto based on the delay data supplied from the linearizing memory 16.

FIG. 2A is a circuit diagram illustrating a variable driving impedance type minute variable delay cell 12a. In FIG. 2A, $V_{dd}$ denotes a positive power supply voltage and $V_{ss}$ denotes a negative power supply voltage. Either one of these power supply voltages can be used as ground. The delay data is supplied to a delay data terminal 26 from the linearizing memory 16 (see FIG. 1). The minute variable delay cell 12a can change the delay time period for the input signal depending on a logical value of the delay data. More specifically, the driving impedance is set low when the logical value of the delay data is "0", while the driving impedance is set high when the logical value of the delay data is "1". Thus, when the delay data has the logical value of "1", the input signal input to an input terminal 22 is delayed more than when the delay data has the logical value of "0", and is then output from an output terminal 24. The variable delay circuit 10 shown in FIG. 1 can achieve a delay-setting resolution from about 10 (ps) to about 100 (ps) by providing the minute variable delay portion 12 as described above and the gate stage number change portion 14.

FIG. 2B is a circuit diagram illustrating a variable load capacitance type minute variable delay cell 12a. The delay data is supplied to a delay data terminal 26 from the linearizing memory 16 (see FIG. 1). The minute delay cell 12a can change the delay time period for the input signal, depending on the logical value of the delay data. When the delay data has the logical value of "1", the load capacitance is set. Thus, the input signal input to the input terminal 22 when the delay data has the logical value of "1" is delayed more than when the delay data has the logical value of "0", and is output from the output terminal 24. The variable delay circuit 10 shown in FIG. 1 can achieve a delay-setting resolution from about 10 (ps) to about 100 (ps) by providing the minute variable delay portion 12 described above and the gate stage number change portion 14.

The conventional variable delay circuit 10 shown in FIG. 1 can be designed with a delay-setting resolution of 10 picoseconds or less, and several nanoseconds. In some cases, however, an error occurs between a designed delay time period and a delay time period actually provided by the delay element because of variation of self-heating of each delay element, change of ambient temperature, change in the power source voltage and the like.

FIG. 3 is a graph showing an example of delay characteristics of the variable delay circuit 10. An axis of abscissas represents a delay time set in the variable delay circuit 10 while an axis of ordinates represents the actual delay time achieved by the variable delay circuit. A line 30 represents ideal delay characteristics of the variable delay circuit 10. On the line of the ideal delay characteristics, the set delay time is equal to the actual delay time. A line 32 represents delay characteristics in a case where a propagation time period of the delay element is excessively long, while a line 34 represents delay characteristics in a case where the propagation time period of the delay element is excessively short.

Each of the lines 32 and 34 have errors with respect to the line 30. One of the errors is a gain error. Moreover, the lines 32 and 34 have discontinuous portions that are non-linear errors, as is apparent from the graph. This is because the variable delay elements included in the variable delay circuit 10 are a plurality of different types, therefore the effects on the results of the variation of the element characteristics, the temperature change and the like do not always coincide with each other.

In order to compensate for the non-linearity of the delay characteristics, a method for measuring the delay time periods provided by all the combinations of the delay elements is applied in advance, and the delay elements are then re-arranged so as to obtain a desired delay characteristic. The measured data is stored in the linearizing memory 16 (see FIG. 1) and used during the test of the semiconductor device, i.e., the device to be tested.

In this case, it is necessary to prepare in advance a delay circuit having redundancy, considering factors causing the errors such as variation of the element characteristics, the fluctuation of the temperature or the power source voltage. When all possible factors causing errors are considered, the variation of the characteristics of typical semiconductor devices is approximately ±30%. This means that a ratio of the longest delay time period of a semiconductor device to the shortest delay time period thereof is 1.86 (130/70), that is, approximately double. Therefore, in order to produce a variable delay circuit 10 having a predetermined resolution and variable widths under all conditions, a number of redundant circuits are required, resulting in an increase of the circuit scale as a whole. Moreover, a drift of the time may be caused by the fluctuation of the temperature or the power source voltage. This degrades timing precision.

SUMMARY OF THE INVENTION

Therefore, it is an object of the present invention to provide a delay signal generating apparatus that overcomes the above issues in the related art. This object is achieved by combinations described in the independent claims. The dependent claims define further advantageous and exemplary combinations of the present invention.

According to the first aspect of the present invention, a delay signal generating apparatus for outputting a delay signal obtained by delaying a reference signal, includes: a phase shift device capable of outputting a plurality of shift signals having phases shifted from a phase of the reference signal by differing shift amounts, respectively; and a shift signal selector capable of selecting one of the shift signals that has a phase shifted by a predetermined shift amount and outputting the selected shift signal. Thus, the delay signal generating apparatus according to the first aspect of the present invention can output a delay signal having a predetermined delay time period by selecting a predetermined one of a plurality of shift signals.

In an embodiment of the present invention, a plurality of shift signal selectors are provided. The signal selectors can select one of the shift signals that have phases shifted by different shift amounts, respectively, and output a plurality of delay signals respectively having different delay time periods.

In another embodiment of the present invention, the phase shift device may be provided for each of the shift signal selectors.

In still another embodiment of the present invention, it is preferable that the phase shift device includes a plurality of phase shift elements that output a plurality of shift signals independently, by shifting the phase of the reference signal by the different shift amounts, respectively.

In still another embodiment of the present invention, the delay signal generating apparatus may further include a selection control signal supply portion capable of supplying to the shift signal selector a selection control signal for making the shift signal selector select one of the shift signals that is shifted by a predetermined amount.

In still another embodiment of the present invention, the delay signal generating apparatus further includes a shift amount setting portion capable of setting the shift amounts of the shift signals output from the plurality of phase shift elements.

In still another embodiment of the present invention, the shift signal selector may include: a multiplexer capable of selecting one of the shift signals that is shifted by a predetermined shift amount based on the selection control signal; a driver capable of outputting a delay signal based on an output of the multiplexer; and an additional circuit capable of applying to the multiplexer output a voltage of approximately a mid-point between two power supply voltages $V_{dd}$ and $V_{ss}$ ($V_{dd} > V_{ss}$) supplied to the driver.

In still another embodiment of the present invention, the shift signal selector may include: a multiplexer having a plurality of transmission gates to which the plurality of shift signals are input, and a summing portion which sums up outputs of the transmission gates on a point; and an additional circuit capable of applying to the summing portion in the multiplexer, a voltage of approximately mid-point between two power supply voltages $V_{dd}$ and $V_{ss}$ supplied to the summing portion, wherein the multiplexer selects one of the shift signals shifted by the predetermined shift amount by making one of the plurality of transmission gates conductive based on the selection control signal.

In still another embodiment of the present invention, an additional circuit may be included that applies a voltage of approximately a mid-point between two power supply voltages $V_{dd}$ and $V_{ss}$ ($V_{dd} > V_{ss}$) to respective outputs of the plurality of phase shifted elements.

In still another embodiment of the present invention, the delay signal generating apparatus may further include: a reference phase shift element capable of outputting a reference delay signal delayed from the delay signal by a predetermined time period; a timing comparator capable of comparing timings of edges of the delay signal and edges of the reference delay signal and outputting a comparison result as a logical value "0" or a logical value "1"; and a measuring device capable of measuring a delay time period of the delay signal based on the comparison result by the timing comparator.

In still another embodiment of the present invention, the measuring device may include: an averaging portion capable of outputting an average value obtained by averaging the logical value output from the timing comparator at a predetermined period; and a determining portion capable of determining based on the averaged value, whether or not the delay time period of the delay signal is equal to the delay time period of the reference delay signal.

In still another embodiment of the present invention, the determining portion may determine that the delay time period of the delay signal is equal to the delay time period of the reference delay signal, when the averaged value of the logical value is 0.5.

In still another embodiment of the present invention, the delay signal generating apparatus may further include a shift amount adjusting portion, provided for each of the phase shift elements, capable of adjusting the shift amounts of the shift signals output from the plurality of phase shift elements, based on the determination result by the determining portion.

In still another embodiment of the present invention, the phase shift device may include: an oscillator capable of oscillating an oscillation signal having a period the same as that of the reference signal; a pulse insertion portion capable of generating an insertion pulse to be inserted to a referential oscillation signal having a front edge and a rear edge, at least one of which is synchronized with a front edge or a rear edge of the oscillation signal, and to insert the generated insertion pulse into the referential oscillation signal; and a delay phase-locked portion capable of generating one of the shift signals obtained by shifting a phase of the oscillation signal oscillated by the oscillator by a predetermined shift amount from a phase of the reference signal, based on a referential reference signal synchronized with the reference signal and having the same period as that of the referential oscillation signal and the referential oscillation signal with the insertion pulse inserted thereinto.

In still another embodiment of the present invention, the phase shift device may further include a phase comparator capable of outputting the referential reference signal and the referential oscillation signal based on a phase difference between a synchronized oscillation signal synchronized with the oscillation signal and a synchronized reference signal synchronized with the reference signal, and having the same period as that of the synchronized oscillation signal.

According to the second aspect of the present invention, a semiconductor test apparatus for testing a target device, includes: a pattern generator capable of generating, in synchronization with a reference signal, an input pattern signal to be input to the target device and an expected pattern signal to be output from the target device based on the input pattern signal; a delay pattern signal generator capable of generating a delay pattern signal delayed from the input pattern signal by a predetermined time period from a phase of the reference signal, depending on input characteristics of the target device; and a comparator capable of comparing an output pattern signal output from the target device based on the delay pattern signal, with the expected pattern signal. The delay pattern signal generator includes: a phase shift device capable of outputting a plurality of shift signals having phases shifted from the phase of the reference signal by different shift amounts, respectively; a shift signal selector capable of selecting one of the shift signals shifted by a predetermined shift amount and outputting a delay signal obtained by delaying the reference signal; and a delay pattern signal outputting portion capable of delaying the pattern signal delayed from the input pattern signal by the predetermined time period, based on the delay signal.

This summary of the invention does not necessarily describe all essential features so that the invention may also be a sub-combination of these described features.

BRIEF DESCRIPTION OF THE DRAWINGS

FIG. 2A is a circuit diagram illustrating a variable driving impedance type minute variable delay cell 12a.

FIG. 2B is a circuit diagram illustrating a variable load capacitance type minute variable delay cell 12a.

FIG. 10C shows another example of the voltage control type variable delay cell 110b constituting the voltage control type oscillator 110.

FIG. 12A shows a state where the insertion pulses 194 are inserted in concentrated portions into the referential oscillation signal 190.

FIG. 12B shows a low-frequency ripple occurring in a power source, caused by concentrated insertion of the insertion pulses 194 into the referential oscillation signal 190.

FIG. 12C shows a state where the insertion pulses 194 are inserted into the referential oscillation signal 190 in a time-series distributed manner.

FIG. 13 shows an example of combinations of cycles into which the insertion pulses 194 are inserted, based on the phase control signal 138 generated by the phase control portion 116 having the structure shown in FIG. 9.

DETAILED DESCRIPTION OF THE INVENTION

The invention will now be described based on preferred embodiments, which do not intend to limit the scope of the present invention, but rather to exemplify the invention. All of the features and the combinations thereof described in the embodiments are not necessarily essential to the invention.

Figure 1:
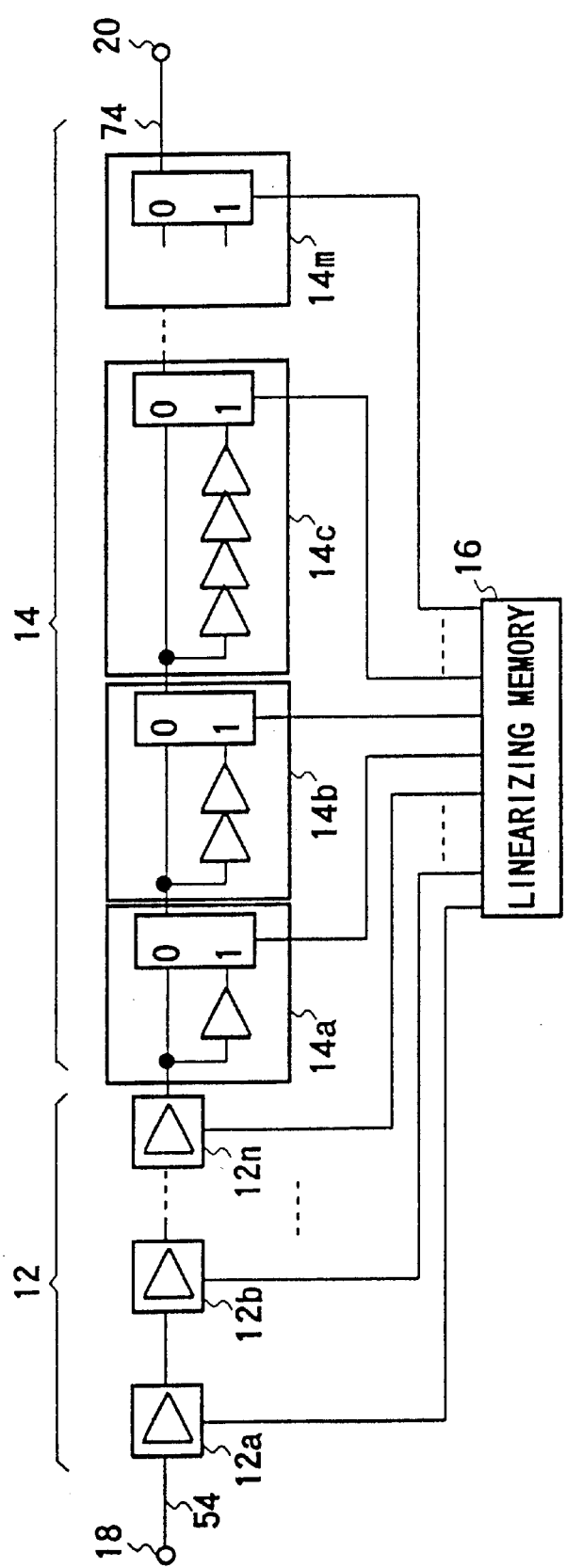
FIG. 1 is a block diagram schematically showing a conventional variable delay circuit 10 that delays a reference signal 54 to generate a delay signal 74 having a predetermined delay time.
Figure 2A:
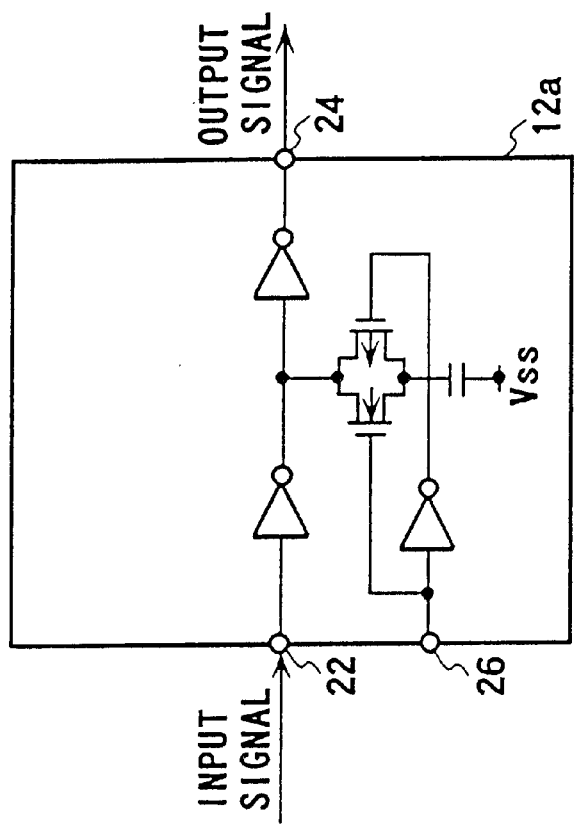
Figure 2B:
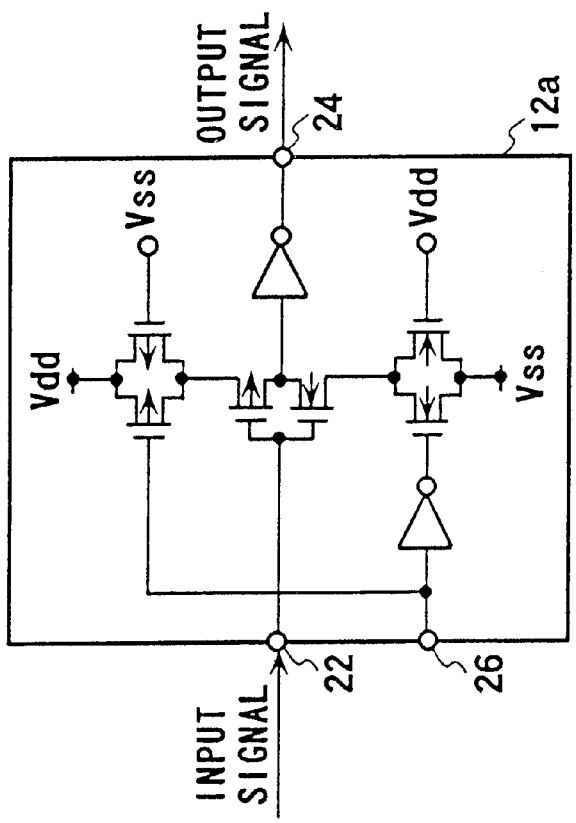
Figure 3:
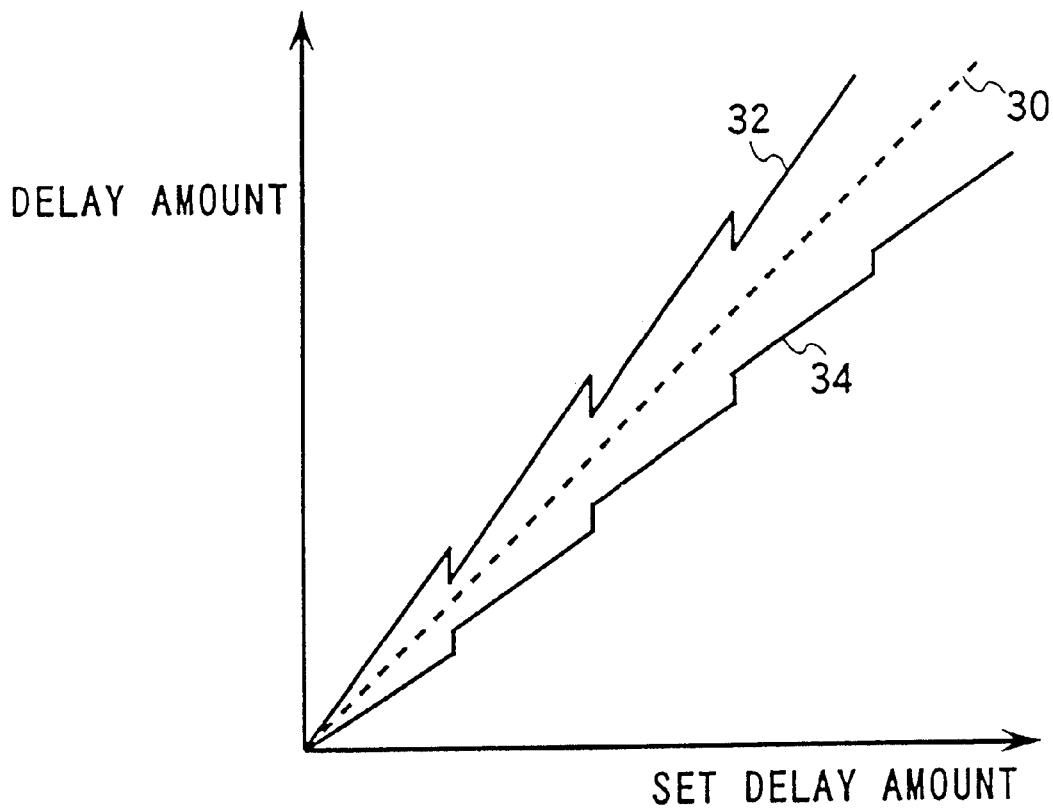
FIG. 3 is a graph showing an example of delay characteristics of the variable delay circuit 10.
Figure 4:
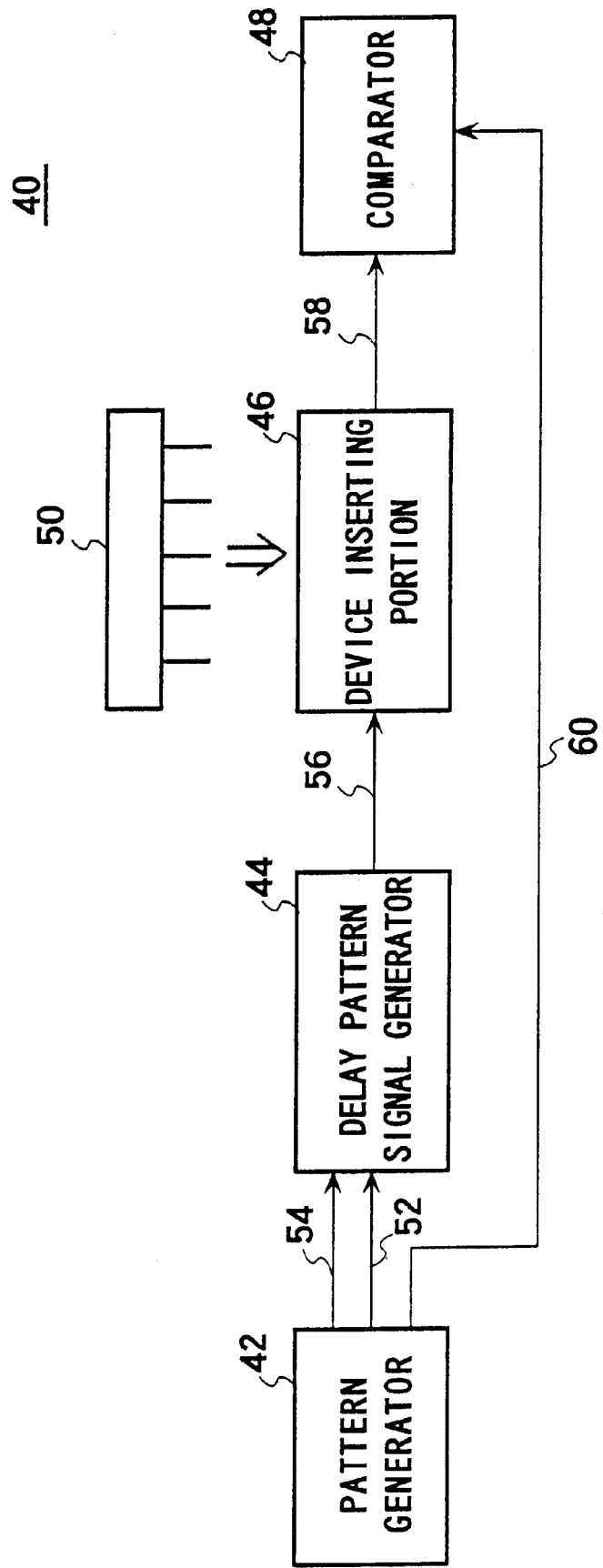
FIG. 4 is a block diagram showing a semiconductor testing apparatus 40 for testing a target device 50.

FIG. 4 is a block diagram showing a semiconductor testing apparatus 40 for testing a device 50. The semiconductor testing apparatus 40 includes a pattern generator 42, a delay pattern signal generator 44, a device insertion portion 46 and a comparator 48. During a test, the device 50 to be tested is inserted into the device insertion portion 46.

The pattern generator 42 generates an input pattern signal 52 that is to be input to the device 50 to be tested and a reference signal 54, and supplies them to the delay pattern signal generator 44. The input pattern signal 52 is generated in synchronization with the reference signal 54. In a case where the device 50 to be tested is a memory device, for example, the input pattern signal 52 includes an address signal, a data signal, a control signal and the like.

The delay pattern signal generator 44 generates a delay pattern signal 56 obtained by delaying the input pattern signal 52 by a predetermined time period from a phase of the reference signal 54, depending on the input characteristics of the device 50 to be tested. For example, in the case where the input pattern signal 52 includes an address signal, a data signal, a control signal and the like, the delay pattern signal generator 44 delays the respective signals included in the input pattern signal 52 by time periods required by the device 50 to be tested. The delay pattern signal 56 is supplied to the device 50 to be tested via the device insertion portion 46.

The device 50 to be tested outputs an output pattern signal 58 based on the delay pattern signal 56. When the device 50 to be tested is a memory device, data stored in the memory device is output as the output pattern signal 58 in accordance with the delay pattern signal 56. When the device 50 to be tested is an operational device, the result of an operation performed in accordance with the delay pattern signal 56 is output as the output pattern signal 58. The output pattern signal 58 is input to the comparator 48.

The pattern generator 42 generates an expected pattern signal 60 to be output from the device 50 to be tested, based on the input pattern signal 52 (the delay pattern signal 56), in synchronization with the reference signal 54. The expected pattern signal 60 is a signal expected to be output as an output response from the device 50 to be tested, if the device 50 to be tested operates normally. The expected pattern signal 60 is input to the comparator 48.

The comparator 48 determines whether the device 50 to be tested is good or defective by comparing the output pattern signal 58 with the expected output pattern signal 60. More specifically, when the output pattern signal 58 does not coincide with the expected pattern signal 60, the comparator 48 determines that the device 50 to be tested is defective.

Figure 5:
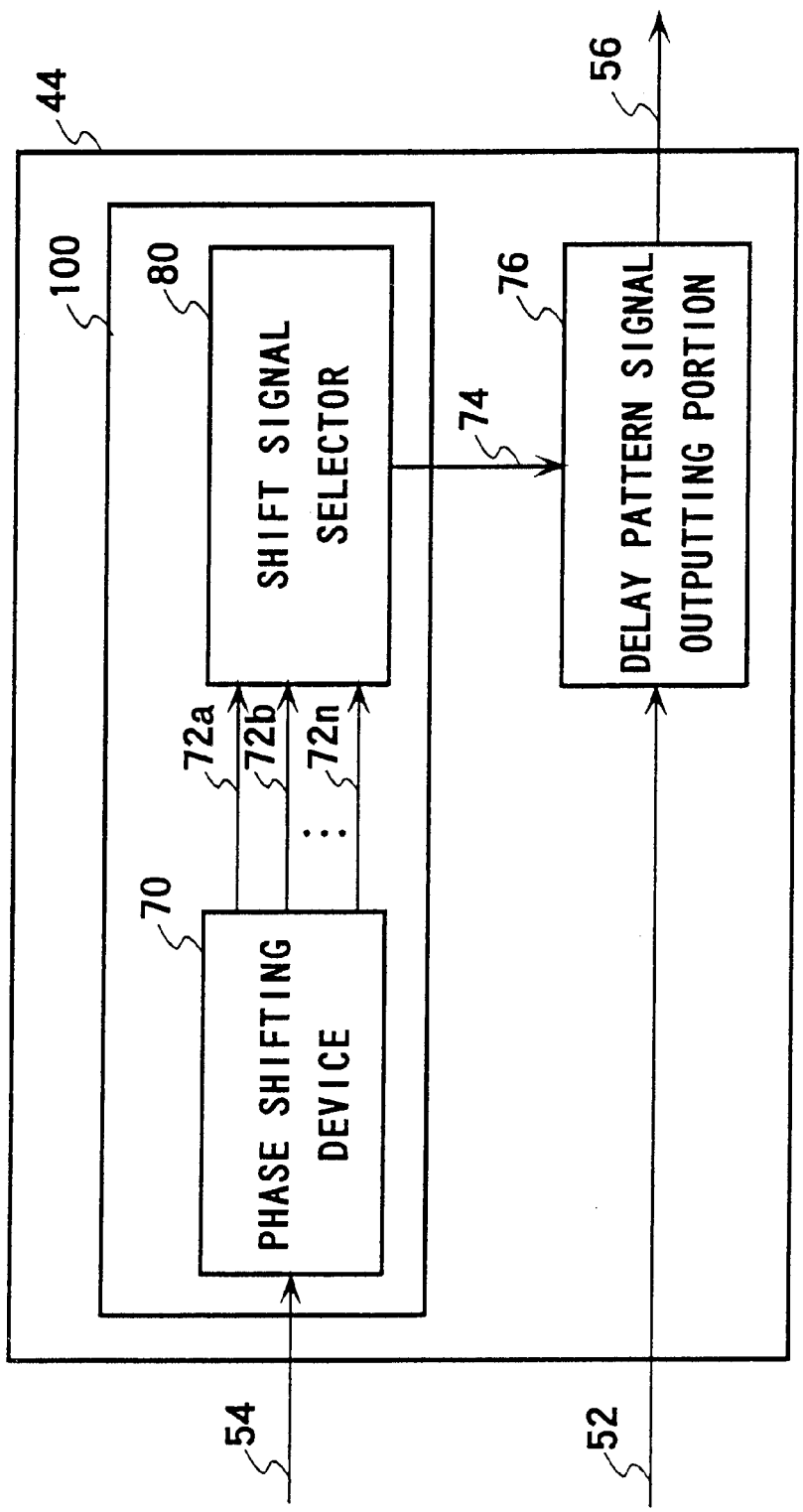
FIG. 5 is a block diagram of an embodiment of the delay signal generator 44 according to the present invention.

FIG. 5 is a block diagram of an embodiment of the delay signal generator 44 according to the present invention. The delay pattern signal generator 44 includes a delay signal generating apparatus 100 and a delay pattern signal outputting portion 76. The delay signal generating apparatus 100 has a phase shifting device 70 and a shift signal selector 80.

The pattern generator 42 (not shown in FIG. 5) generates the input pattern signal 52 and the reference signal 54. The reference signal 54 is input to the phase shifting device 70 which outputs to the shift signal selector 80 a plurality of shift signals 72a, 72b, ..., 72n obtained by shifting the phase of the reference signal 54 by different amounts, respectively. It is preferable that the phase shifting device 70 generates the shift signals 72a, 72b, ..., 72n independently of each other. The periods of the reference signal 54 and those of the shift signals 72a, 72b, ..., 72n are equal to each other. The shift signal selector 80 selects one of the shift signals 72a, 72b, ..., 72n that has a phase shifted by a predetermined shift amount, and outputs the selected one as a delay signal 74 delayed from the reference signal 54 by a predetermined time period. The predetermined shift amount described above is determined in advance, based on the input characteristics of the device 50 to be tested. The delay signal 74 is supplied to the delay pattern signal outputting portion 76.

The delay pattern signal outputting portion 76 outputs the delay pattern signal 56 obtained by delaying the input pattern signal 52 by a predetermined time period, in accordance with the delay signal 74. In other words, the delay pattern signal outputting portion 76 outputs the delay pattern signal 56 obtained by delaying the input pattern signal 52, at a timing of the delay signal 74. The delay pattern signal 56 is input to the device 50 (not shown) to be tested, as described with reference to FIG. 4. During testing of the device 50 to be tested, it is preferable that the delay pattern signal generator 44 includes the delay signal generating apparatus 100 and the delay pattern signal outputting portion 76 both of which have the same number of input pins as the device 50 to be tested.

Figure 6:
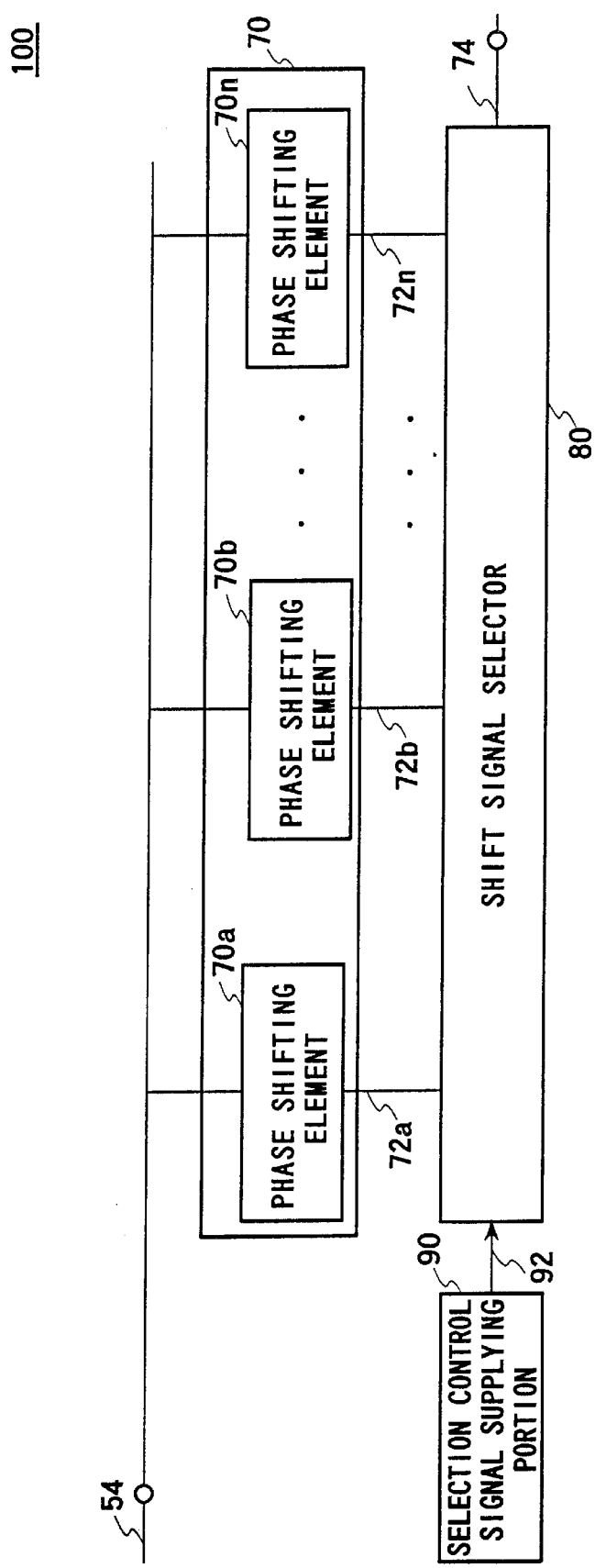
FIG. 6 is a block diagram showing the structure of the delay signal generating apparatus 100 for outputting the delay signal 74 obtained by delaying the reference signal 54 according to the first embodiment of the present invention.

FIG. 6 is a block diagram showing the structure of the delay signal generating apparatus 100 according to the first embodiment of the present invention, which outputs the delay signal 74 obtained by delaying the reference signal 54. The delay signal generating apparatus 100 includes the phase shifting device 70, the shift signal selector 80 and a selection control signal supplying portion 90. The phase shifting device 70 includes a plurality of phase shifting elements 70a, 70b, ..., 70n that are arranged in parallel.

The reference signal 54 is input to the respective phase shifting elements 70a, 70b, ..., 70n in parallel. The phase shifting elements 70a, 70b, ..., 70n shift the phase of the reference signal 54 by different shift amounts, respectively, thus outputting a plurality of shift signals 72a, 72b, ..., 72n independently. In a case where the phase shifting device 70 outputs the shift signals 72a, 72b, ..., 72n obtained by dividing the clock interval of the reference signal 54 at a constant interval, the number k of the required phase shifting elements 70a, 70b, ..., 70n is represented by the following expression, $$k = T/\Delta t + 1$$

where T is the period of the reference signal 54 and $\Delta t$ is the resolution. From this, the shift signals 72a, 72b, ..., 72n having the resolution of $\Delta t$ and the phase k can be generated with at least k phase shift elements. The shift signals 72a, 72b, ..., 72n having the phase k are input to the shift signal selector 80.

The selection control signal supplying portion 90 supplies a selection control signal 92 which makes the shift signal selector 80 select one of the shift signals 72a, 72b, ..., 72n of k phases, that are obtained by delaying a predetermined shift amount. In a case where the delay signal generating apparatus 100 is used in the semiconductor testing apparatus 40 (see FIG. 4), the selection control signal supplying portion 90 outputs the selection control signal 92 based on a time at which the input pattern signal 52 is supplied to the device 50 to be tested. The shift signal selector 80 selects one shift signal having the phase delayed by a predetermined amount based on the selection control signal 92, and then outputs it as the delay signal 74.

Figure 7:
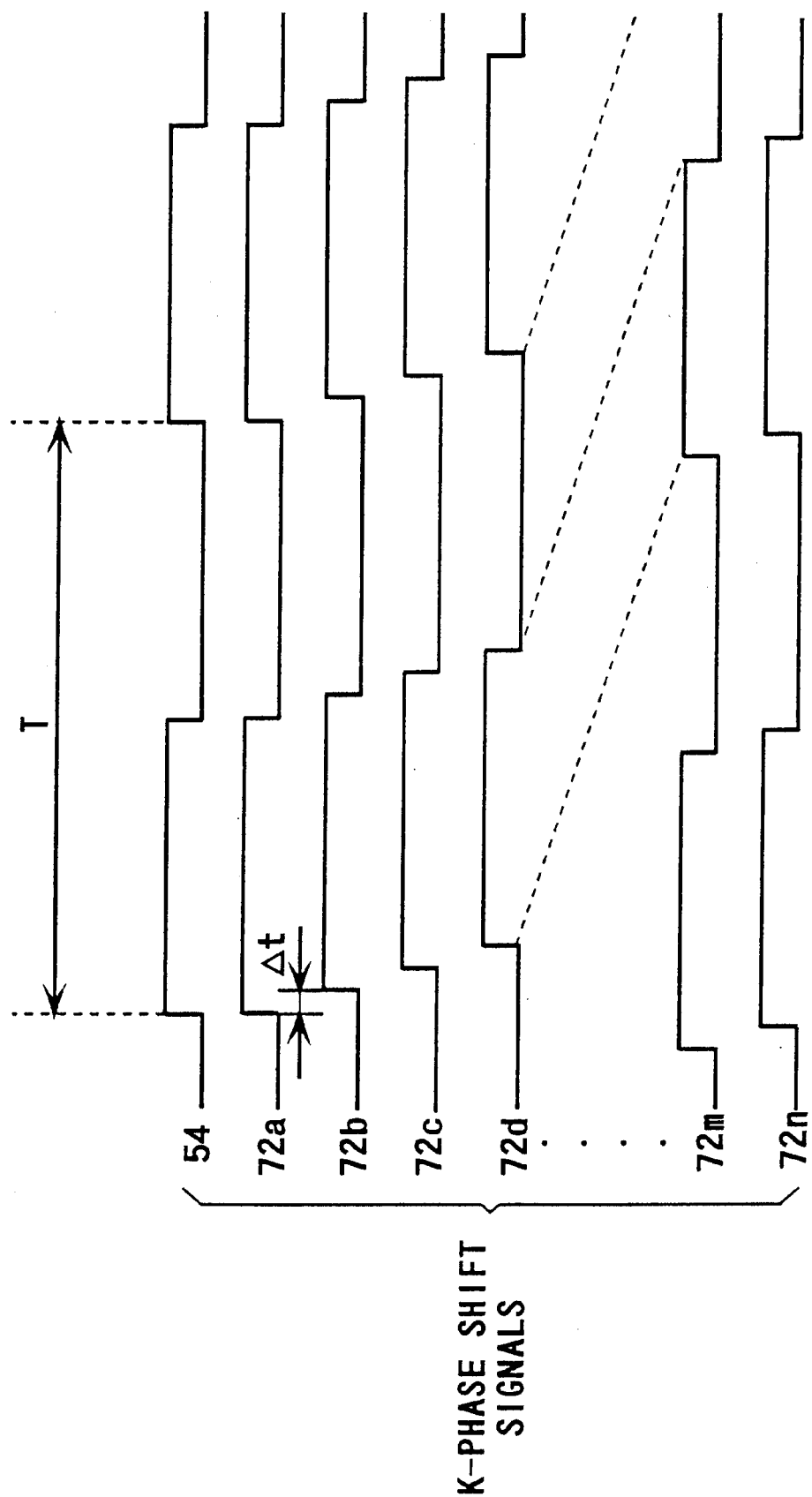
FIG. 7 is a chart showing a time relationship between the reference signal 54 and the phase signal 72a to 72n of k phase.

FIG. 7 is a chart showing a time relationship between the reference signal 54 and the phase signals 72a, 72b, . . . , 72n of k phase. The period of the reference signal 54 is T, and is substantially the same as that of the respective one of the shift signals 72a, 72b, . . . , 72n of k phase. Referring to FIG. 6, the phase shifting element 70a outputs the shift signal 72a that is synchronized with the reference signal 54. The phase shifting element 70b outputs the shift signal 72b having the phase delayed by Δt from that of the reference signal 54 (the shift signal 72a). As shown in FIG. 7, the phase shift signals 72c and 72d respectively have their phases delayed by Δ2t and Δ3t from the phase of the reference signal 54. Similarly, the phase shift signal 72n output from the phase shifting element 70n is a signal having the phase delayed from that of the reference signal 54 by (k−1) Δt. As described above, the phase shifting device 70 can output the shift signals 72a, 72b, . . . , 72n of k phase, obtained by delaying the reference signal 54 by the same shift amount corresponding to a predetermined resolution.

With reference to FIGS. 6 and 7, an example is explained in which the phase shifting device 70 outputs the shift signals 72a, 72b, . . . , 72n of k phase. Alternatively, the phase shifting device 70 may output shift signals having desired delay time periods.

Figure 8:
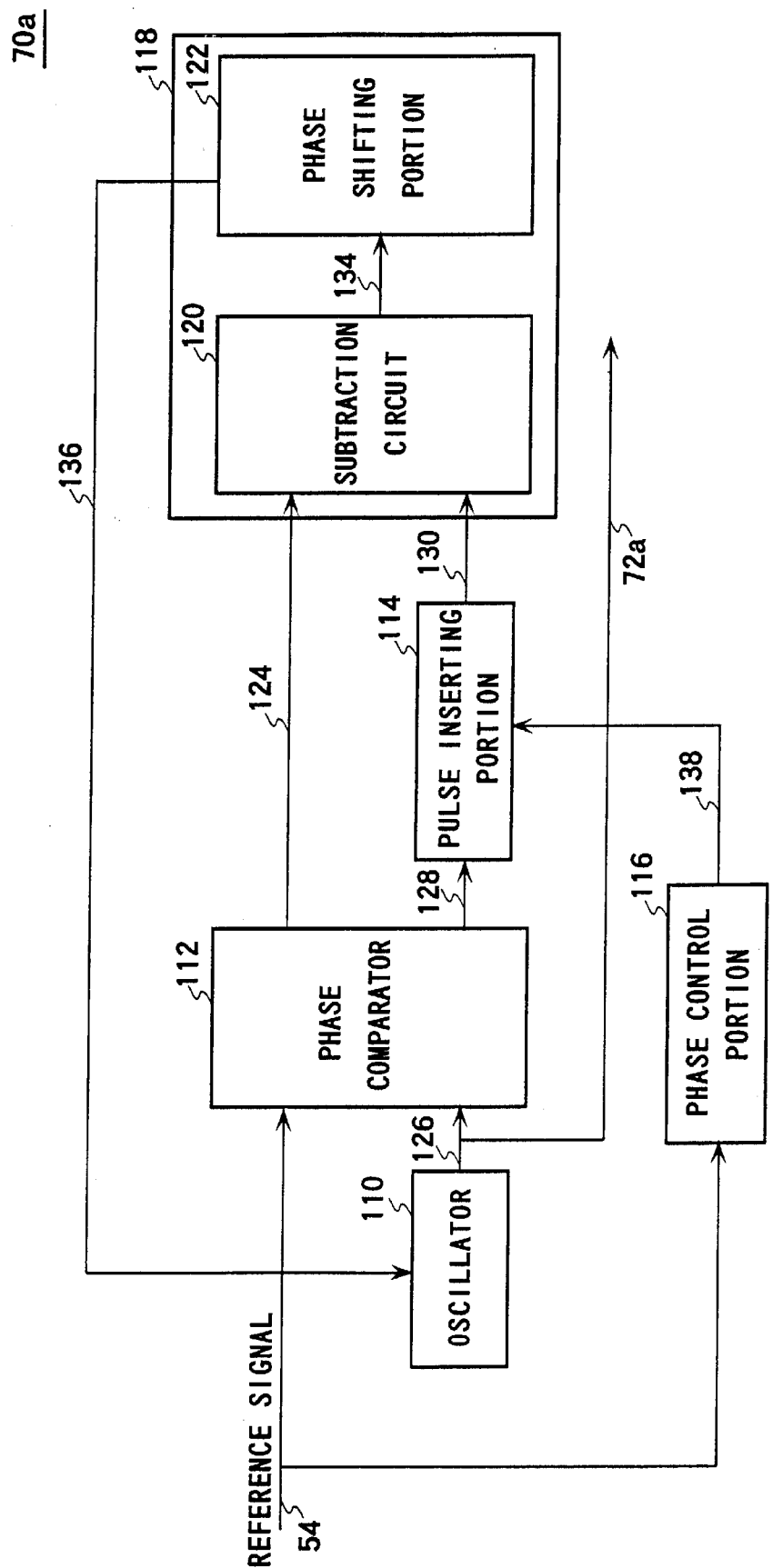
FIG. 8 is a block diagram showing an embodiment of the phase shifting element 70a that outputs the shift signal 72a having the phase delayed from that of the reference signal 54 by a predetermined shift amount.

FIG. 8 is a block diagram showing an embodiment of the phase shifting element 70a that outputs the shift signal 72a having the phase delayed from that of the reference signal 54 by a predetermined shift amount. Although a plurality of phase shifting elements 70a, . . . , 70n are shown, only the phase shift element 70a is described as a typical phase shifting element, referring to FIG. 8. In addition, although the phase shifting element 70a is shown to output the shift signal 72a synchronized with the reference signal 54 in FIG. 7, it is assumed in this example that the phase shifting element 70a can generate the shift signal 72a having a desired shift amount. The phase shifting element 70a includes an oscillator 110, a phase comparator 112, a pulse insertion portion 114, a phase control portion 116 and a delay phase-locked-loop portion 118 which includes a subtraction circuit 120 and a phase shifting portion 122.

The reference signal 54 is input to the phase comparator 112 and the phase control portion 116. The oscillator 110 can oscillate an oscillation signal 126 having the same period as that of the reference signal 54. The phase comparator 112 compares the phases of the reference signal 54 and the oscillation signal 126, and outputs a referential reference signal 124 and a referential oscillation signal 128 based on the phase difference between the reference signal 54 and the oscillation signal 126. The referential reference signal 124 is synchronized with the reference signal 54 and has the same period as that of the referential oscillation signal 128. The referential oscillation signal 128 is a signal in which either one of a front edge or a rear edge is synchronized with a front edge or a rear edge of the oscillation signal 126, respectively. The referential oscillation signal 128 is supplied to the pulse insertion portion 114.

The phase control portion 116 receives the reference signal 54 and generates a phase control signal 138 that determines which one(s) of a plurality of cycles of the referential oscillation signal 128 an insertion pulse is to be inserted into. It is desirable that the phase control portion 116 generates the phase control signal 138 so as to disperse the insertion pulses in a time-series manner into a plurality of cycles. The pulse insertion portion 114 generates the insertion pulse to be inserted into the referential oscillation signal 128 and inserts it into the cycle(s) of the referential oscillation signal 128 determined by the phase control signal 138. The insertion pulse is inserted between the rear edge of the referential oscillation signal 128 and the front edge of the next referential oscillation signal 128.

The delay phase-locked-loop portion 118 delays the phase of the oscillation signal 126 oscillated by the oscillator 110 with respect to the phase of the reference signal 54, based on the referential reference signal 124 and the referential oscillation signal 130 into which the insertion pulse was inserted. This delay is made in order for the oscillator 110 to generate the shift signal 72a that is delayed from the reference signal 54 by a predetermined time period. More specifically, the phase-locked-loop portion 118 can delay the phase of the oscillation signal 126 based on the number of insertions of the insertion pulse into a plurality of cycles of the referential oscillation signal 128 and the pulse width of the insertion pulse. To achieve this, the phase-locked-loop portion 118 includes the subtraction circuit 120 and the phase shifting portion 122 in the present embodiment. The subtraction circuit 120 outputs an averaged subtraction result 134 obtained by subtracting potentials of a series of pulses of the referential oscillation signal 130 into which the insertion pulse is inserted, from the potentials of a series of pulses of the reference signal 54, and then averaging the subtraction result.

If the averaged subtraction result 134 is 0, it is indicated that the oscillation signal 126 oscillated by the oscillator 110 is the same as the shift signal 72a delayed from the reference signal 54 by a predetermined (desired) time period. On the other hand, if the averaged subtraction result 134 is not 0, this means that the oscillation signal 126 has not yet been delayed by the predetermined delay time period from the reference signal 54. In this case, the phase shifting portion 122 adjusts an oscillation frequency of the oscillator 110 so as to make the averaged subtraction result from the subtraction circuit 120 equal to 0. More specifically, the phase shifting portion 122 adjusts the oscillation frequency of the oscillator 110, in order to shift the phase of the oscillation signal 126 until the averaged subtraction result 134 from the subtraction circuit 120 is 0, thereby adjusting the pulse width of the referential oscillation signal 130.

When the oscillator 110 changes the oscillation frequency in accordance with the power supply voltage, the phase shifting portion 122 outputs a control delay signal 136 for adjusting the power supply voltage of the oscillator 110, based on the averaged subtraction result 134 from the subtraction circuit 120. In this way, the oscillator 110 can adjust the amount of phase shift of the oscillation signal 126. In a case where the oscillator 110 is formed on a single chip together with a plurality of electronic circuits, it is preferable to provide a power-supply-voltage supplying portion (not shown) for supplying the adjusted power supply voltage to the electronic circuits, based on the averaged subtraction result 134. This enables compensation for temperature drift and error in the timing caused by the fluctuation in the power supply voltage.

The oscillator 110 may be a voltage control type oscillator having a variable oscillation frequency depending on the control voltage. For example, the oscillator 110 may be a ring oscillator in which a plurality of voltage control type variable delay cells are connected annularly. In this case, the phase shifting portion 122 can output the control delay signal 136 for adjusting the control voltage of the oscillator 110, based on the averaged subtraction result 134 from the subtraction circuit 120, thereby adjusting the phase shift amount of the oscillation signal 126 by the oscillator 110.

As described above, when the averaged subtraction result 134 from the subtraction circuit 120 is 0 in the phase shifting element 70a shown in FIG. 8, that is, when the sum of the pulse widths in a predetermined cycle of the reference signal 54 is equal to the sum of the pulse widths of the referential oscillation signal 130 into which the pulses were inserted, the oscillator 110 oscillates the shift signal 72a having a predetermined delay time period. By locking such a state, the oscillator 110 can continue to oscillate the shift signal 72a having the predetermined delay time period.

Figure 9:
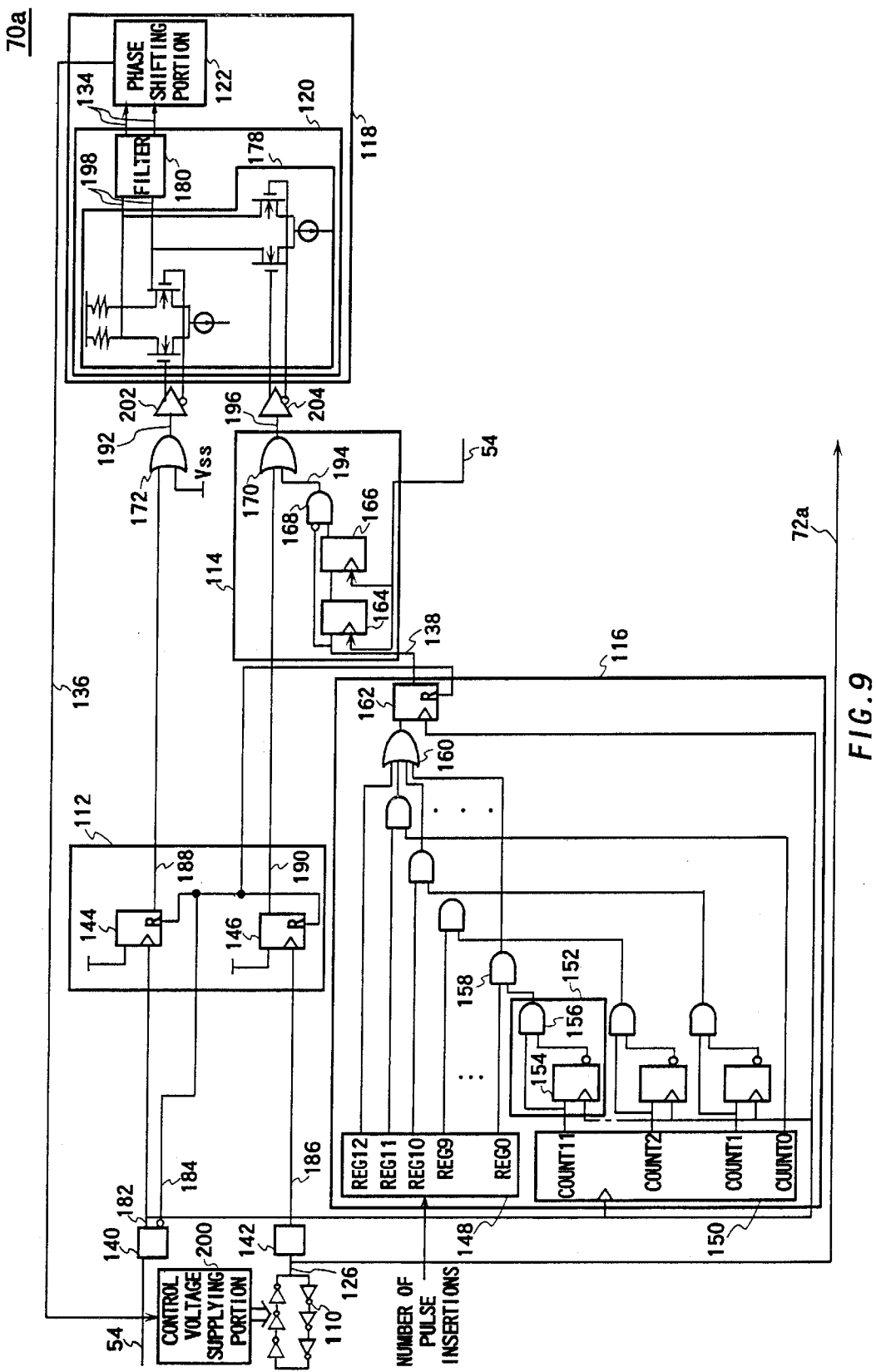
FIG. 9 is a circuit diagram showing an embodiment of the phase shifting element 70a for outputting the shift signal 72a having the phase delayed from that of the reference signal 54 by a predetermined shift amount.

FIG. 9 is a circuit diagram showing an embodiment of the phase shifting element 70a for outputting the shift signal 72a having the phase delayed from that of the reference signal 54 by a predetermined shift amount. This diagram corresponds to the block diagram shown in FIG. 8. In FIG. 9, components labeled with the same reference numerals as those in FIG. 8 have the same or similar functions and operations as the corresponding components in FIG. 8. The phase shifting element 70a shown in FIG. 9 includes the oscillator 110, the phase comparator 112, the pulse insertion portion 114, the phase control portion 116, the delay phase locked loop portion 118, a control voltage supplying portion 200, a synchronized reference signal generator 140, a synchronized oscillation signal generator 142, an OR gate 172 and drivers 202 and 204. In this embodiment, the oscillator 110 is a ring oscillator in which a plurality of voltage control type variable delay cells are connected to form a ring, and can oscillate an oscillation signal 126 having the same period as that of the reference signal 54.

The synchronized reference signal generator 140 outputs, based on the reference signal 54 input thereto, a synchronized reference signal 182 that is synchronized with the reference signal 54. Similarly, the synchronized oscillation signal generator 142 outputs, based on the oscillation signal 126, a synchronized oscillation signal 186 that is synchronized with the oscillation signal 126. The synchronized reference signal 182 and the synchronized oscillation signal 186 have the same period. In this embodiment, each of the synchronized reference signal generator 140 and the synchronized oscillation signal generator 142 is a ⅛ frequency divider, which divides the frequency of the signal input thereto into ⅛ segments. Alternatively, another frequency divider, such as a ¼ frequency divider that provides a signal having ¼ of the frequency of the input signal, a ½ frequency divider that provides a signal having ½ the frequency of the input signal, or a ¹⁄₁ frequency divider may be used. The ¹⁄₁ frequency divider may be a buffer. The synchronized oscillation signal generator 142 is provided in order to insert the insertion time into a time period between the rear edge of the referential oscillation signal 190 and the front edge of the next referential oscillation signal 190, i.e., the duration of the logical value "0" of the referential oscillation signal 190, thereby widening the duration of the logical value "0". Therefore, if the insertion pulse 194 can be inserted into the duration of the logical value "0" of the oscillation signal 126, the synchronized oscillation signal generator 142 can be formed by a buffer or can be omitted.

The phase comparator 112 includes flip-flops 144 and 146. The pulse insertion portion 114 includes flip-flops 164, 166, an AND gate 168 and an OR gate 170. The oscillator 110 may be formed on a single chip together with a plurality of electronic circuits such as the phase comparator 112 and the pulse insertion portion 114.

The phase control portion 116 includes a pulse insertion setting register 148, a counter 150, a plurality of change point detecting portions 152, a plurality of AND gates 158, an OR gate 160 and a flip-flop 162. The counter 150 is an M (M is a natural number) bit counter. In this embodiment, the counter 150 is a 12-bit counter having 12 bits from the least significant bit COUNT0 to the most significant bit COUNT11. The pulse insertion setting register 148 is an (M+1) bit register that stores the number of insertions of the insertion pulse into the pulse insertion portion 114. In this embodiment, the pulse insertion setting register 148 is a 13-bit register, having 13 bits from the least significant bit REG0 to the most significant bit REG12.

Each change point detecting portion 152 includes a flip-flop 154 and an AND gate 156, and can detect a change point of the bit of the counter 150. In this embodiment, a change point detecting portion 152 is provided for each of the bits from COUNT1 to COUNT11 of the counter 150. The AND gate 158 provides the logical product (AND) of a register value corresponding to the (M−n+1) th bit of the pulse insertion setting register 148 and an output value from the change point detecting portion 152 corresponding to the n-th bit of the counter 150. Here, n is a natural number. For the bit COUNT0, no change point detecting portion 152 is provided. Therefore, the associated AND gate 158 provides the logical product (AND) of an output value from the bit COUNT0 and a register value of REG11.

In the illustrated structure, REG0 corresponds to COUNT11; REG1 corresponds to COUNT10; REG2 corresponds to COUNT9; REG3 corresponds to COUNT8; REG4 corresponds to COUNT7; REG5 corresponds to COUNT6; REG6 corresponds to COUNT5; REG7 corresponds to COUNT4; REG8 corresponds to COUNT3; REG9 corresponds to COUNT2; REG10 corresponds to COUNT1; and REG11 corresponds to COUNT0. The OR gate 160 provides the logical sum of output values from the AND gates 158 and the bit REG12. An output from the OR gate 160 is supplied to the flip-flop 162 which supplies the phase control signal 138 for determining a time of insertion of the insertion pulse to the pulse insertion portion 114.

The delay phase-locked-loop portion 118 includes the subtraction circuit 120 and the phase shifting portion 122. The subtraction circuit 120 includes a subtractor 178 and a filter 180. The subtractor 178 conducts a subtracting operation for two inputs, and the filter 180 supplies a voltage value to the phase shifting portion 122 obtained by averaging the subtraction result. The phase shifting portion 122 adjusts the phase of the oscillation signal 126 by adjusting the control voltage of the control voltage supplying portion 200.

The operations of the respective components for generating the shift signal 72a are described below.

The reference signal 54 is divided by the synchronized reference signal generator 140 to have ⅛ of the frequency of the input frequency. The resultant signal that is synchronized with the reference signal 54 is input to a clock input of the flip-flop 144 as the synchronized reference signal 182. The oscillator 110 oscillates the oscillation signal 122 having the same period as that of the reference signal 54. The oscillation signal 126 is then divided by the synchronized oscillation signal generator 142 to have ⅛ of the frequency of the input frequency. The resultant signal that is synchronized with the oscillation signal 126 is input to a clock input to the flip-flop 146 as the synchronized oscillation signal 186. The synchronized reference signal 182 and the synchronized oscillation signal 186 have the same period.

In this embodiment, each of the reference signal 54 and the oscillation signal 126 are divided by the synchronized reference signal generators 140 and 94 to have ⅛ the frequency of the input frequency. Alternatively, each of the reference signal 54 and the oscillation signal 126 may be divided at another division rate, or may remain undivided. In this embodiment, the term "synchronized reference signal" means a clock having a front edge synchronized with the front edge of the reference signal 54, while the term "synchronized oscillation signal" means a clock having a front edge synchronized with the front edge of the oscillation signal 126. In an alternative embodiment in which the synchronized reference signal generators 140 and 94 are not provided, the reference signal 54 may be used as the synchronized reference signal 182 and the oscillation signal 126 may be used as the synchronized oscillation signal 186.

An inverted synchronized reference signal 184 obtained by inverting the synchronized reference signal 182 is input to R-inputs (reset inputs) of the flip-flops 144 and 146. The flip-flops 144 and 146 are reset at the front edge of the inverted synchronized reference signal 184 (that is, the rear edge of the synchronized reference signal 182). Thus, the rear edge of the synchronized oscillation signal 186 is made to coincide with that of the synchronized reference signal 182. In this way, the phase comparator 112 outputs the referential reference signal 188 and the referential oscillation signal 190 having the rear edges coinciding with each other, based on the phase difference between the synchronized oscillation signal 186 and the synchronized reference signal 182. More specifically, the flip-flop 144 outputs the referential reference signal 188, and the flip-flop 146 outputs the referential oscillation signal 190 in which the pulse-width is shortened, in accordance with the phase difference between the synchronized reference signal 182 and the synchronized oscillation signal 186. In this embodiment, the synchronized reference signal 182 and the referential reference signal 188 are the same series of pulses.

In another embodiment, the rear edges of the synchronized oscillation signal 186 and the synchronized reference signal 182 may coincide with each other at a time different from the time of the rear edge of the synchronized reference signal 182. In any case, it is preferable that the phase comparator 112 outputs the referential reference signal 188 and the referential oscillation signal 190 having the rear edges coinciding with each other, based on the phase difference between the synchronized oscillation signal 186 and the synchronized reference signal 182.

The pulse insertion setting register 148 stores the number of insertions into the pulse insertion portion 114 of the insertion pulse. More specifically, the pulse insertion setting register 148 stores the number of insertions of the insertion pulse into the referential oscillation signal 190, 4096 cycles (12 bits) in advance. The amount of the phase shift of the shift signal 72a from the phase of the reference signal 54 is set in accordance with the number of insertions of the insertion pulse stored in the pulse insertion setting register 148, as described later.

The counter 150 is a 12-bit counter that increases its output value based on the synchronized reference signal 182 having ⅛ of the frequency of the input frequency. The outputs of COUNT1 to COUNT11 are supplied to the change point detecting portions 152 respectively provided for COUNT1 to COUNT11, respectively. In FIG. 9, only the change point detecting portion 152 provided for COUNT11 is shown. The change point detecting portion 152 may be provided after COUNT0, although it is not provided in this embodiment.

The change point detecting portion 152 can detect a change point of the bit of the counter 150. The change point detecting portion 152 is provided after each of COUNT1 to COUNT11, as described above. The typical operation of the change point detecting portion 152 provided after COUNT11 is described below.

The output of COUNT11 is input to a data input of the flip-flop 154. To the clock input of the flip-flop 154, the synchronized reference signal 182 having ⅛ the frequency of the input frequency is input. An output of the flip-flop 154 is inverted and then input to one input terminal of the AND gate 156. To the other input terminal of the AND gate 156, the output of COUNT11 is input. Therefore, when the output of COUNT11 changes from the logical value "0" to the logical value "1" based on the synchronized reference signal 182, the AND gate 156 outputs the logical value "1". Similarly, the change point detecting portions 152 provided after COUNT1 to COUNT10 respectively conduct the operation described above.

In the structure of the phase control portion 116 shown in FIG. 9, a change point detecting portion 152 is not provided for COUNT0. This is because it is unnecessary to provide a change point detecting portion for COUNT0 which outputs the logical values "0" and "1" alternately, since the change point detecting portion 152 only detects the point at which the output value of the bit of the counter 150 changes. Therefore, it can be considered that the change point detecting portion is already provided for COUNT0. However, the change point detecting portion may actually be provided after COUNT0, as in the case of COUNT1 to COUNT11.

When the insertion pulses are inserted in concentration into a plurality of cycles (4096 cycles (12 bits) in this embodiment) in the pulse insertion portion 114, a low frequency ripple may occur in the power source and output signal. Thus, it is preferable that the insertion pulses are temporarily distributed over the plurality of cycles of the referential oscillation signal 190 in a time-series manner.

In order to distribute the insertion pulses over the plurality of cycles of the referential oscillation signal 190, the AND gate 158 provides the logical product of the register value corresponding to the (M−n+1) th bit of the pulse insertion setting register 148 and the output value of the change point detecting portion 152 corresponding to the n-th bit of the counter 150. It is noted that n is a natural number. More specifically, to one input of each AND gate 158 is input the output of REG(12−n) of the pulse insertion setting register 148, while to the other input is input the output of the change point detecting portion 152 corresponding to COUNT(n−1) of the counter 150 or the output of COUNT0, where n satisfies the following relationship; 1≦n≦12. When the output of REG(12−n), and the output of the change point detecting portion 152 corresponding to COUNT(n−1) or the output of COUNT0 have the logical value "1", each of the associated AND gates 158 outputs the logical value "1".

The outputs of all the AND gates 158 are input to the OR gate 160. The output of the bit REG12 is also input to the OR gate 160. In this embodiment, when 4096 (#1000000000000) insertion pulses are inserted into 4096 cycles, the register value of REG12 is "1". The OR gate 160 provides the logical sum of the outputs of all the AND gates 158 and the register value of REG12, and outputs the logical sum to the data input of the flip-flop 162 provided thereafter. The insertion times of the insertion pulses that are determined by the above structure will be described in detail later, referring to FIG. 13.

To the clock input of the flip-flop 162, the synchronized reference signal 182 having ⅛ the frequency is input. To the R-input (reset input) of the flip-flop 162, the inverted synchronized reference signal 184 obtained by inverting the synchronized reference signal 182 is input. The flip-flop 162 outputs, to the pulse insertion portion 114, the phase control signal 138 that determines which cycle(s) of the referential oscillation signal 190 the insertion pulse(s) is/are to be inserted into, based on the synchronized reference signal 182, the inverted synchronized reference signal 184 and the output of the OR gate 160.

The phase control signal 138 is input to the data input of the flip-flop 164. The data output from the flip-flop 164 is input to the data input of the flip-flop 166. To the clock, inputs of the flip-flops 164 and 166 and the reference signal 54 of 266 MHz are input, so as to make both the flip-flops 164 and 166 operate. The data output from the flip-flop 166 is input to one input terminal of the AND gate 168. To the other input terminal of the AND gate 168, the phase control signal 138 is input, after being inverted.

The AND gate 168 obtains the logical product of the phase control signal 138 after being inverted and the output data of the flip-flop 166, in order to output the insertion pulse 194. Since the pulse insertion portion 114 has the structure described above, the insertion pulse 194 can be inserted between the rear end of the referential oscillation signal 190 and the front edge of the next referential oscillation signal. More specifically, the AND gate 168 outputs an insertion pulse 194 that rises at a time coinciding with the rear edge of the referential oscillation signal 190, continues to maintain the logical value "1" for two periods of the reference signal 54 of 266 MHz, and then falls.

The OR gate 170 obtains the logical sum of the referential oscillation signal 190 and the insertion pulse 194, and inserts the insertion pulse 194 into the referential oscillation signal 190. The OR gate 170 outputs to the driver 204 the referential oscillation signal 196 with the insertion pulse 194 inserted thereinto. The driver 204 outputs to the subtractor 178 the referential oscillation signal 196 in a differential mode. Similarly, the referential reference signal 188 is supplied to the OR gate 172 which outputs the referential reference signal 192 to the driver 202 in turn. The referential reference signals 188 and 192 are the same series of pulses. The driver 202 outputs to the subtractor 178 the referential reference signal 192 in a differential mode.

The subtractor 178 subtracts a potential of a pulse series of the referential oscillation signal 196 into which the insertion pulse 194 has been inserted, from a potential of a pulse series of the referential reference signal 192. The subtraction result 198 is averaged by the filter 180. The filter 180 outputs the averaged subtraction result 134 to the phase shifting portion 122. The averaged subtraction result 134 is related to the phase difference between the reference signal 54 and the oscillation signal 126, the pulse-width of the insertion pulse 194 and the number of insertions.

When the averaged subtraction result 134 is 0, this means the phase of the shift signal 72a (the oscillation signal 126) has a desired (predetermined) shift amount, with respect to the phase of the reference signal 54. In other words, an averaged subtraction result of 0 indicates that the shift signal 72a is delayed from the reference signal 54 by a predetermined time period. On the other hand, when the averaged subtraction result 134 is not 0, the shift signal 72a does not have the desired delay time period. Thus, it is necessary to adjust the shift amount of the oscillation signal 196 by changing the oscillation frequency of the oscillator 110. The phase shifting portion 122 generates the control delay signal 136 for adjusting the control voltage of the control voltage supplying portion 200, based on the averaged subtraction result 134. The control voltage supplying portion 200 adjusts the control voltage to be supplied to the oscillator 110 based on the control delay signal 136, so as to adjust the frequency of the oscillation signal 126. The delay phase-locked-loop portion 118 adjusts the control voltage until the averaged subtraction result 134 is 0, and then locks such a state when the averaged subtraction result 134 is 0. In this way, it is possible to generate a shift signal 72a having the predetermined delay time period.

Figure 10A:
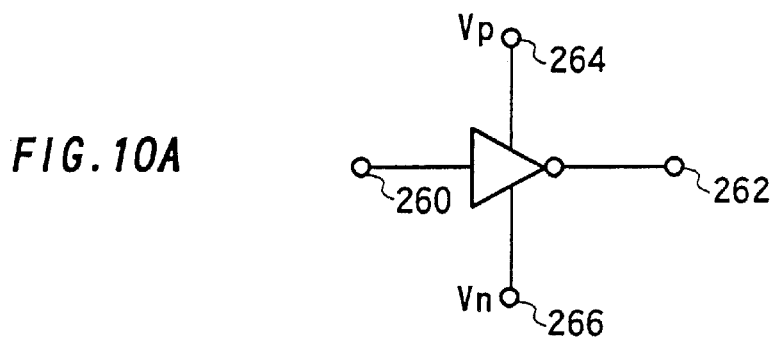
FIG. 10A shows a voltage control type variable delay cell 110a that constitutes the voltage control type oscillator 110.

FIG. 10A shows a voltage control type variable delay cell 110a that constitutes the voltage control type oscillator 110. The voltage control type variable delay cell 110a includes an input terminal 260, an output terminal 262, and control terminals 264 and 266.

Figure 10B:
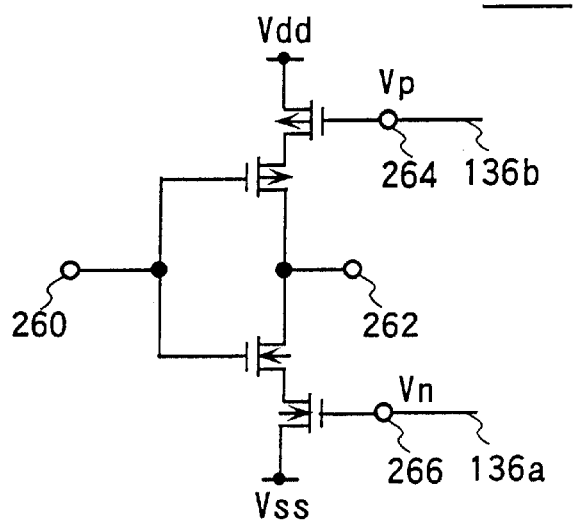
FIG. 10B shows an example of the voltage control type variable delay cell 110a that constitutes the voltage control type oscillator 110.

FIG. 10B shows an example of the voltage control type variable delay cell 110a that constitutes the voltage control type oscillator 110. In FIG. 10B, $V_{dd}$ represents a positive power supply voltage, and $V_{ss}$ is a negative power supply voltage. A delay control signal 136b is input to the control terminal 264. A delay control signal 136a is input to the control terminal 266. The delay control signals 136a and 136b correspond to the delay control signal 136 shown in FIG. 9. The delay control signal 136b has the control voltage Vp while the delay control signal 136a has the control voltage Vn.

The voltage control type variable delay cell 110a varies the delay amount thereof based on the control voltage Vn of the delay control signal 136a and the control voltage Vp of the delay control signal 136b. In a case where the control voltages Vn and Vp are a high positive voltage and a high negative voltage, respectively, the delay time period of a signal passing through the voltage control type variable delay cell 110a is short. On the other hand, when the control voltages Vn and Vp are a low positive voltage and a low negative voltage, respectively, the delay time period of the signal passing through the voltage control type variable delay cell 110a is long.

FIG. 10C shows another example of the voltage control type variable delay cell 110b constituting the voltage control type oscillator 110. In FIG. 10C, $V_{dd}$ represents a positive power supply voltage and $V_{ss}$ represents a negative power supply voltage. The delay control signal 136b is input to the control terminal 264. The delay control terminal 136a is input to the control terminal 266. The delay control signal 136b has the control voltage Vp and the delay control signal 136a has the control voltage Vn.

The voltage control type variable delay cell 110b varies the delay amount thereof based on the control voltage Vn of the delay control signal 136a and the control voltage Vp of the delay control signal 136b. In a case where the control voltages Vn and Vp are a high positive voltage and a high negative voltage, respectively, the delay time period of the signal passing through the voltage control type variable delay cell 110b is short. On the other hand, in a case where the control voltages Vn and Vp are a low positive voltage and a low negative voltage, respectively, the delay time period of the signal passing through the voltage control type variable delay cell 110b is long.

Figures 11A, 11B:
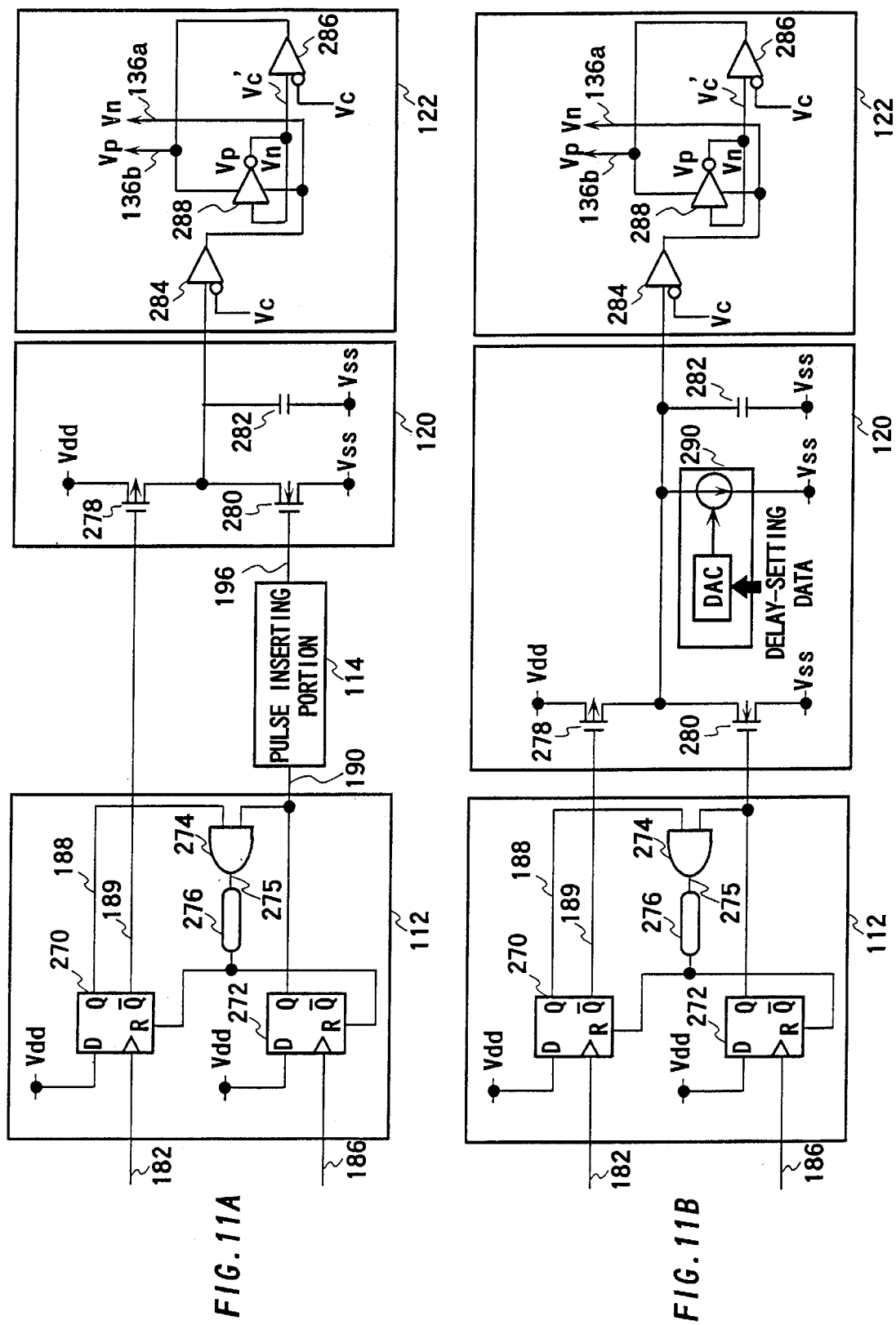
FIG. 11A shows another embodiment of a part of the structure of the phase shifting element 70a shown in FIG. 9.
FIG. 11B shows a modified embodiment of a part of the structure of the phase shifting element 170a shown in FIG. 11A.

FIG. 11A shows another embodiment of a part of the structure of the phase shifting element 70a shown in FIG. 9. In FIG. 11A, the phase comparator 112, the pulse insertion portion 114, the subtraction circuit 120 and the phase shifting portion 122 are shown. The phase comparator 112 includes flip-flops 270 and 272, an AND gate 274 and a delay element 276. The subtraction circuit 120 includes FETs 278 and 280 and a capacitor 282. The phase shifting portion 122 includes differential amplifiers 284 and 286 and a voltage control type variable delay cell 288. In FIG. 11A, $V_{dd}$ represents a positive power supply voltage and $V_{ss}$ represents a negative power supply voltage. $V_c$ is a mid-point voltage of $V_{dd}$ and $V_{ss}$.

The synchronized reference signal 182 is input to a clock input of the flip-flop 270, while the synchronized oscillation signal 186 is input to a clock input of the flip-flop 272. When the flip-flop 270 receives the front edge of the synchronized reference signal 182, it outputs the referential reference signal 188 that is synchronized with the front edge of the synchronized reference signal 182 via an output Q. Similarly, when the flip-flop 272 receives the front edge of the synchronized oscillation signal 186, it outputs the referential oscillation signal 190 that is synchronized with the front edge of the synchronized oscillation signal 186 via an output Q. The referential reference signal 188 and the referential oscillation signal 190 are input to the AND gate 274. When both the logical values of the referential reference signal 188 and the referential oscillation signal 190 become "1", the AND gate 274 outputs a reset signal 275 having the logical value "1". The reset signal 275 is delayed by the delay element 276 for a predetermined time period and then input to R-inputs (reset inputs) of the flip-flops 270 and 272. The flip-flops 270 and 272 change the logical values of the referential reference signal 188 and the referential oscillation signal 190 to "0", respectively, when receiving the reset signal 275. The rear edges of the referential reference signal 188 and the referential oscillation signal 190 are made to coincide with each other in the above manner.

The flip-flop 270 outputs the inverted referential reference signal 189 obtained by inverting the referential reference signal 188, via an inverted output Q to the FET 278. The referential oscillation signal 190 having the rear edge coinciding with that of the referential reference signal 188 is input to the pulse insertion portion 114. The pulse insertion portion 114 inserts the insertion pulse into the referential oscillation signal 190, as described with reference to FIG. 9. The pulse insertion portion 114 outputs to the FET 286 the referential oscillation signal 196 in which the insertion pulse has been inserted.

The FET 278 opens its gate when the logical value of the inverted referential reference signal 189 is "1", and supplies a positive voltage $V_{dd}$ to the capacitor 282. The FET 280 opens its gate when the logical value of the referential oscillation signal 196 into which the insertion pulse has been inserted is "1", and supplies a negative voltage Vss to the capacitor 282. The capacitor 282 averages electric charges supplied in accordance with the power supply voltages $V_{dd}$ and $V_{ss}$.

When the referential oscillation signal 196 has a pulse-width longer than that of the referential reference signal 188 (that corresponds to the duration of the logical value "0" of the inverted referential reference signal 189), the capacitor 282 is charged with negative electric charges. The differential amplifier 284 amplifies a difference between the voltage averaged by the capacitor 282 and the mid-point voltage $V_c$, and outputs the delay control signal 136a having the control voltage Vn.

Figure 10B:
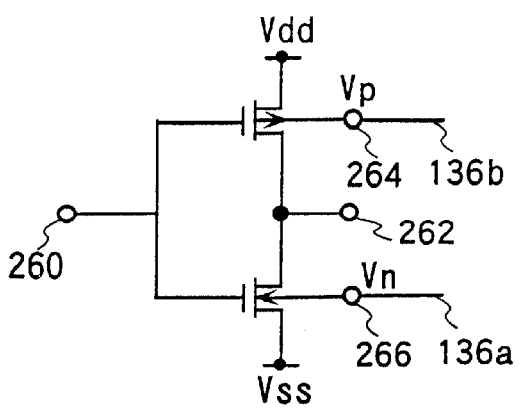

The voltage control type variable delay cell 288 and the differential amplifier 286 generate an inverted averaged voltage obtained by inverting the averaged voltage of the capacitor 282. The voltage control type variable delay cell 288 may be replaced with the voltage control type variable delay cell 110a shown in FIG. 10. A logical threshold value $V'_c$ of the voltage control type variable delay cell 288 to which the control voltages Vp and Vn are supplied is supplied to the differential amplifier 286 which amplifies a difference between the logical threshold value $V'_c$ and the mid-point voltage $V_c$, and outputs the delay control signal 136b having the control voltage Vp.

The voltage control type variable delay cell 288 can generate the control voltages Vp and Vn symmetrically while maintaining the logical threshold value. In this embodiment, the mid-point between the power supply voltages $V_{dd}$ and $V_{ss}$ is referred to, so that the logical threshold value $V'_c$ is made equal to the midpoint voltage Vc.

The delay control signals 136a and 136b are supplied to the voltage control type variable delay cell 110a constituting the oscillator 110. Referring to FIG. 9, the oscillator 110 adjusts the oscillation frequency based on the delay control signals 136a and 136b (i.e., the control voltages Vn and-Vp).

FIG. 11B shows a modified embodiment of a part of the structure of the phase shifting element 170a shown in FIG. 11A. In FIG. 11B, the phase comparator 112 and the phase shifting portion 122 have the same structures as those shown in FIG. 11A. In the modified embodiment, instead of providing the pulse insertion portion 114, the subtraction circuit 120 includes a delay setting portion 290. The delay setting portion 290 includes a DAC (digital-analog converter) and a current source.

The delay setting portion 290 supplies to the capacitor 282 a voltage value corresponding to the shift amount required, based on the input delay setting data. In this embodiment, the DAC controls the current from the current source, so that the potential of the capacitor 282 is adjusted by the current. The potential of the capacitor 282 is supplied to the phase shifting portion 122. The phase shifting portion 122 outputs the delay control signals 136a and 136b that control the oscillator 110, as described with reference to FIG. 11A.

FIGS. 12A to 12C explain an insertion method for inserting the insertion pulses 194 into the referential oscillation signal 190. For the purpose of simplifying the explanation, FIGS. 12A and 12C only show the insertion pulses 194 and do not show the pulses of the referential oscillation signal 190.

FIG. 12A shows a state where the insertion pulses 194 are inserted in concentration into the referential oscillation signal 190. FIG. 12B shows a low frequency ripple that occurs in the power source, caused by the concentrated insertion of the insertion pulses 194 into the referential oscillation signal 190. The ripple occurring in the power source causes the power source voltage to vary, resulting in difficulty to supply a stable voltage. Such a ripple is undesirable for generation of a delay signal that requires a precise delay time period.

FIG. 12C shows a state where the insertion pulses 194 are inserted into the referential oscillation signal 190 in an evenly distributed manner. By inserting the insertion pulses 194 in an evenly distributed manner, the ripple shown in FIG. 12B does not occur, thereby enabling stable voltage supply. Therefore, in order to generate a delay signal having a precise delay time period, it is preferable to insert the insertion pulses 194 in an evenly distributed manner.

Figure 13:
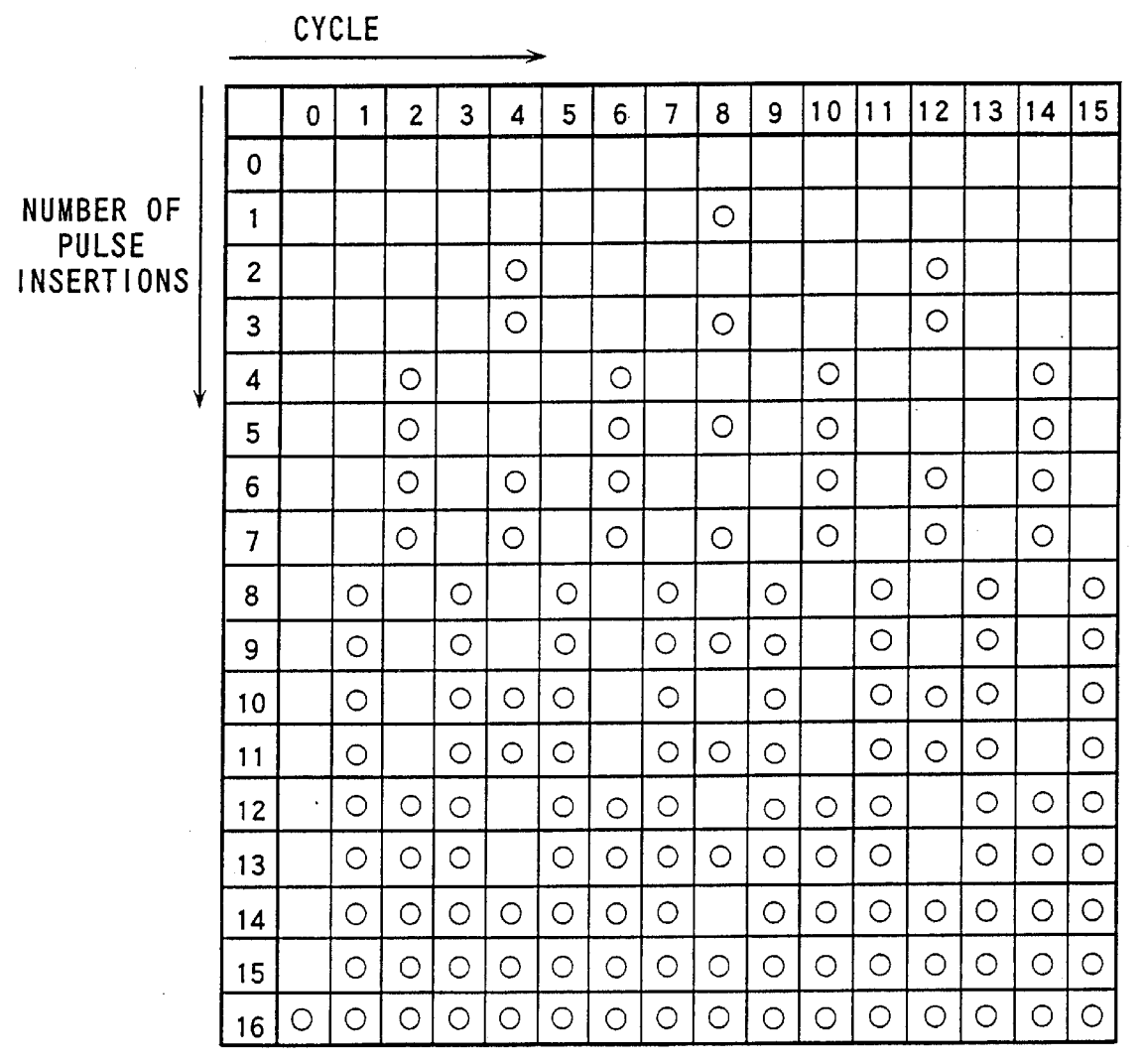

FIG. 13 shows an example of combinations of cycles into which the insertion pulses 194 are inserted, based on the phase control signal 138 generated by the phase control portion 116 having the structure shown in FIG. 9. In this example, times at which the insertion pulses 194 are inserted into the referential oscillation signal 190 of 16 cycles are explained, for simplification of the explanation. In this example, the pulse insertion setting register 148 is a 5-bit register having bits from the least significant bit REG0 to the most significant bit REG4, and the counter 150 is a 4-bit counter having bits from the least significant bit COUNT0 to the most significant bit COUNT3. In this case, as described with reference to FIG. 9, REG0 corresponds to COUNT3; REG1 corresponds to COUNT2; REG2 corresponds to COUNT1; and REG3 corresponds to COUNT0.

In FIG. 13, the number of insertions of the insertion pulse is shown in the left-most column while the cycle numbers are shown in the upper-most row. A mark ○ indicates that the insertion pulse is to be inserted into the corresponding cycle. As is apparent from FIG. 13, the phase control portion 116 in this embodiment can insert the insertion pulses 194, distributing them in a time-series manner (over a plurality of cycles). In a case of inserting the insertion pulses 194 into all 16 cycles, that is, in a case of setting the number of insertions to 16 (#10000), "1" is stored in REG4 so that the insertion pulse 194 is always inserted into the referential oscillation signal 190. In order to insert the insertion pulses into all of the cycles, it is preferable that the number of bits of the pulse insertion setting register 148 is more than the number of bits of the counter 150 by one.

Figure 14:
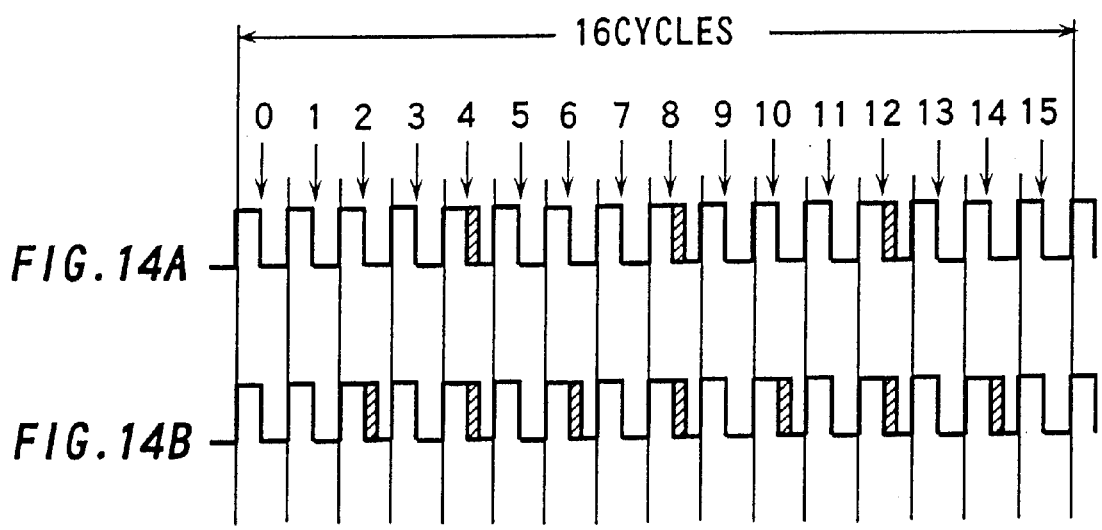
FIG. 14A shows a referential oscillation signal 190 of 16 cycles, into which three insertion pulses 194 were insert ed in the case of setting the number of pulse insertions to three.
FIG. 14B shows a referential oscillation signal 190 of 16 cycles into which seven insertion pulses 194 were inserted in the case of setting the number of pulse insertions to seven.

FIGS. 14A and 14B show the referential oscillation signal 190 into which the insertion pulses 194 have been inserted at the cycles shown in FIG. 13. FIG. 14A shows the 16-cycle referential oscillation signal 190 into which three insertion pulses 194 have been inserted, in case of setting the number of insertions to three. In FIG. 14A, the insertion pulse 194 is indicated by hatching. FIG. 14A shows that the insertion pulses 194 are inserted into the 4th, 8th and 12th cycles of the 16 cycles. FIG. 14B shows the 16-cycle referential oscillation signal 190 into which seven insertion pulses have been inserted. In FIG. 14B, the insertion pulses 194 are inserted into the 2nd, 4th, 6th, 8th, 10th, 12th and 14th cycles.

Figure 15:
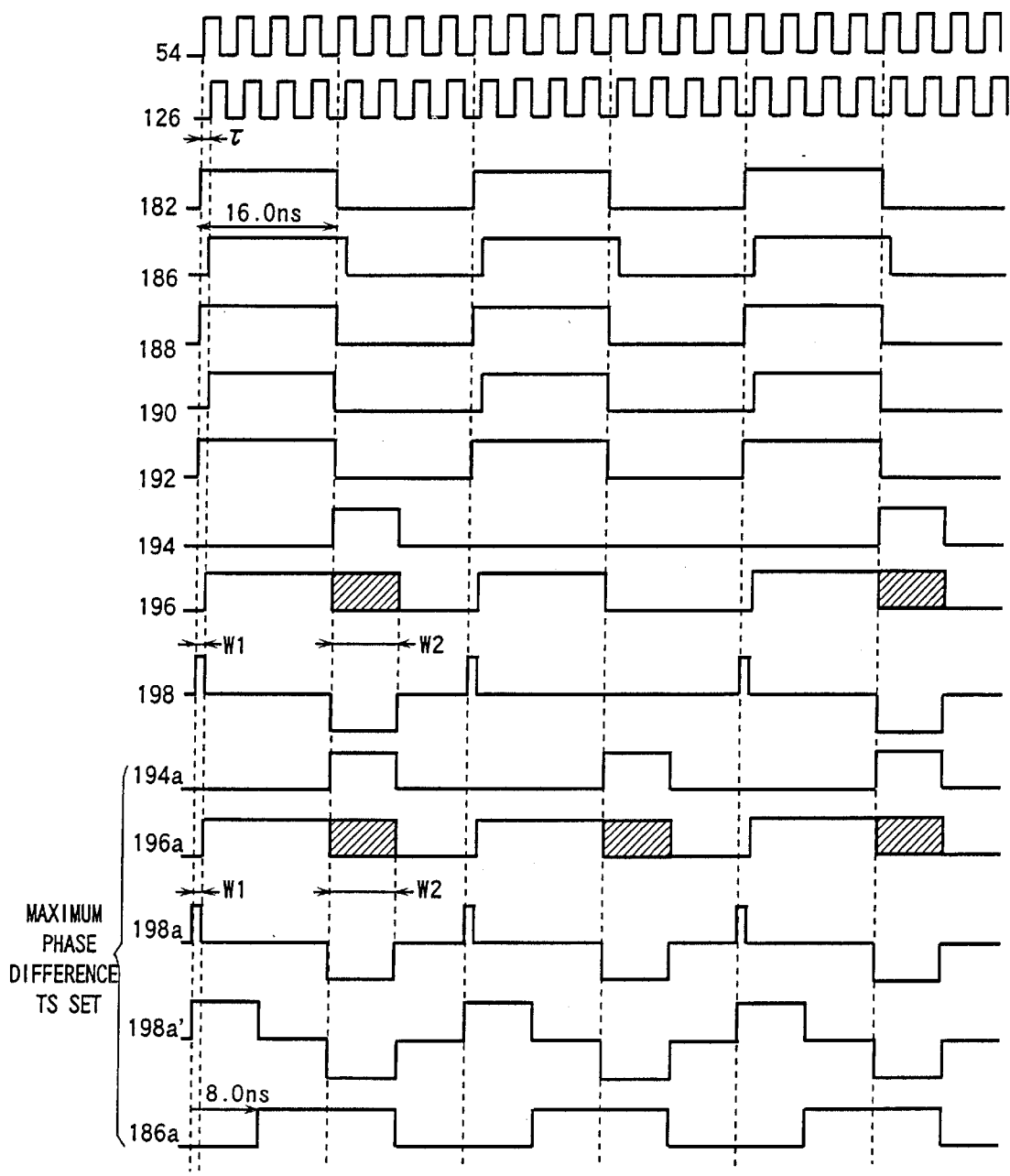
FIG. 15 is a timing chart of the respective signals shown in FIG. 9.

FIG. 15 is a timing chart of the respective signals shown in FIG. 9. Referring to FIGS. 9 and 15, operations of the respective components of the structure shown in FIG. 9 are described in detail.

The reference signal 54 is input to the synchronized reference signal generator 140. In this embodiment, the referential signal 54 has the frequency of 250 MHz (the period of 4.0 ns). The oscillator 110 oscillates an oscillation signal 126 having the same period as that of the reference signal 54. In the example shown in FIG. 15, the oscillation signal 126 is delayed by τ from the reference signal 54. The reference signal 54 and the oscillation signal 126 are input to the synchronized reference signal generator 140 and the synchronized oscillation signal generator 142, respectively, and divided to reduce to ⅛ the frequency of the input frequencies. The ⅛ divided-synchronized reference signal 182 and the ⅛-divided synchronized oscillation signal 186 have the period of 32.0 ns (half of the period is 16.0 ns).

The ⅛-divided synchronized reference signal 182 and the ⅛-divided synchronized oscillation signal 186 are input to the phase comparator 112, where the rear edges of both of the signals are made to coincide with the each other. The referential oscillation signal 190 output from the phase comparator 112 is a pulse having the duration of the logical value "1" in each period that is shorter than the duration of the logical value "1" of the referential reference signal 188 by τ. The referential reference signal 188 is output to the driver 202 as the referential reference signal 192 via the OR gate 172. The referential reference signal 192 is supplied from the driver 202 to the subtractor 178.

The pulse insertion portion 114 generates the insertion pulse 194 based on the reference signal 54. The insertion pulse 194 has the duration of the logical value "1" corresponding to twice the period (i.e., 8.0 ns) of the reference signal 54. The referential oscillation signal 190 and the insertion pulse 194 are input to the OR gate 170 where the logical sum is obtained. The insertion pulse 194 is inserted between the rear edge of the referential oscillation signal 190 and the front edge of the next referential oscillation signal 190. The OR gate 170 outputs to the driver 204 the referential oscillation signal 196 into which the insertion pulse 194 was inserted. Parts of the referential oscillation signal 196 indicated by hatching represent the insertion pulses 194 inserted. The referential oscillation signal 196 is supplied from the driver 204 to the subtractor 178.

The subtractor 178 performs subtraction on the referential reference signal 192 and the referential oscillation signal 196, and outputs the result of the subtraction to the filter 180. The filter 180 averages the result 198 of the subtraction and outputs the averaged subtraction result 134 to the phase shifting portion 122. The phase shifting portion 122 adjusts the control voltage of the oscillator 122 to make the averaged subtraction result 134 equal to 0, thus adjusting the oscillation frequency of the oscillator 110.

The pulse-width based on the phase difference between the reference signal 54 and the oscillation signal 126 is w1 and the pulse-width of the insertion pulse is w2, as shown in the timing chart of the subtraction result 198. Here, w1 is and w2 is 8.0 ns. In this example, assuming that the number of insertions of the insertion pulse 194 is N, the output of the filter 180 is proportion to the following.

$$(W1 \times 4096 \text{ (the number of cycles)}) - (w2 \times N \text{ (the number of insertions)}) \tag{1}$$

The phase shifting portion 122 adjusts the oscillation frequency of the oscillator 110 by changing the pulse-width w1, in order to make a value of Expression (1) equal to 0, thus giving the oscillation signal 126 a desired (predetermined) delay amount and making the oscillator 110 generate the shift signal 72a.

In this embodiment, a case where the insertion pulses 194a are inserted into all the cycles (4096 cycles) of the referential oscillation signal 190 to set the maximum phase difference is described below.

In this case, the insertion pulses 194a are inserted into the referential oscillation signal 190. The insertion pulse 194a is generated every time the referential oscillation signal 190 has the logical value "0". The referential oscillation signal 190 and the insertion pulse 194a are summed in the OR gate 170 to obtain the logical sum. The OR gate 170 then outputs to the driver 204 the referential oscillation signal 196a which includes the insertion pulses 194a inserted thereinto. The referential reference signal 192 and the referential oscillation signal 196a are subtracted in the subtractor 178, which outputs the result 198a of the subtraction.

Referring to Expression (1), w2 and N in this case are 8.0 ns and 409, respectively. The phase shifting portion 122 adjusts the oscillation frequency of the oscillator 110 in order to generate the averaged subtraction result 134 obtained by averaging the subtraction result 198a equal to 0. When the subtractor 178 later outputs the subtraction result 198a' that is a series of pulses each having a pulse-width w1 of 8.0 ns, the averaged subtraction result 134 becomes 0. At this time, the oscillator 110 oscillates the synchronized oscillation signal 186a having the delay time period (corresponding to the maximum phase difference) of 8.0 ns.

As described above, the phase shifting element 70a in the present embodiment can precisely generate a shift signal 72a having the phase shifted from that of the reference signal 54 by a predetermined shift amount, in accordance with the number of insertions of the insertion pulse into a predetermined number of cycles (4096 cycles). In the present embodiment, all of the insertion pulses 194 have the same pulse-width. Alternatively, the pulse-widths of the insertion pulses 194 may be adjusted. This enables generation of the shift signal 72a having a predetermined shift amount (delay time period). For example, when the insertion pulses 194 having the pulse-width equal to a desired delay time period are inserted into all of the cycles of the referential oscillation signal 190, a shift signal 82a having a predetermined (desired) shift amount can be generated.

Figure 16:
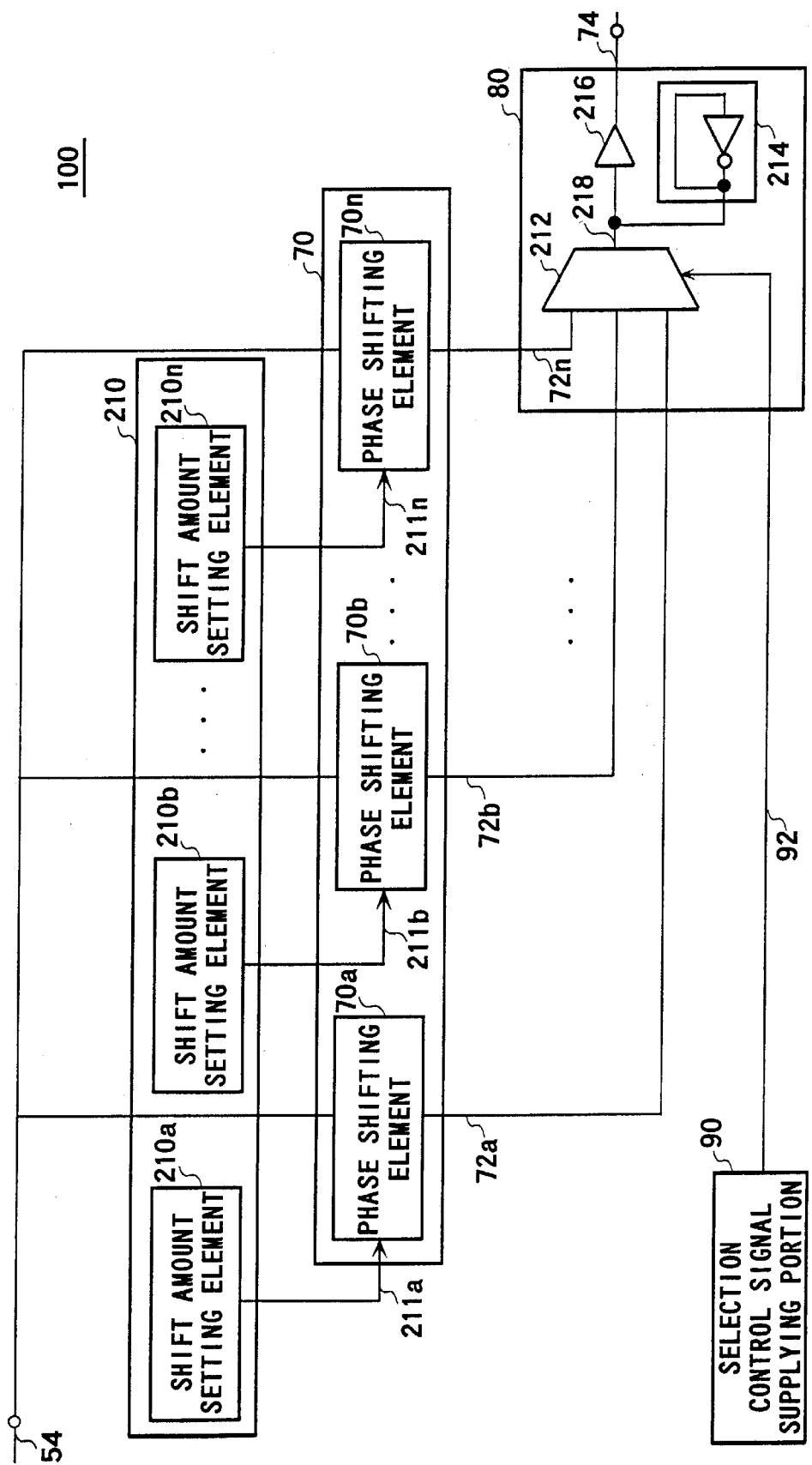
FIG. 16 is a block diagram of a delay signal generating apparatus 100 that outputs the delay signal 74 obtained by delaying the reference signal 54, according to the second embodiment of the p resent invention.

FIG. 16 is a block diagram of the delay signal generating apparatus 100 that outputs the delay signal 74 obtained by delaying the reference signal 54, according to the second embodiment of the present invention. The delay signal generating apparatus 100 includes the phase shifting device 70, the shift signal selector 80, the selection control signal supply portion 90 and a shift amount setting device 210. The phase shifting device 70 includes a plurality of phase shift elements 70a, 70b, ..., 70n. The shift amount setting device 210 includes a plurality of shift amount setting elements 210a to 210n. The shift signal selector 80 includes a multiplexer 212, an additional circuit 214 and a driver 216. The components with the same reference numerals as those in FIG. 6 have the same or similar functions to the corresponding components shown in FIG. 6. In addition, the phase shift elements 70 (70a to 70n) may have the same or similar structures to those shown in FIGS. 7 to 15.

The reference signal 54 is input to a plurality of phase shift elements 70a to 70n. The shift amount set elements 210a to 210n output shift amount set signals 211a to 211n for setting the shift amounts of the shift signals 72a to 72n output from the phase shift elements 70a to 70n, respectively. When the phase shift elements 70a to 70n are pulse insertion type shift signal generators described with reference to FIGS. 7 to 15, the phase shift amount set elements 210a to 210n may use the shift amount set signals 211a to 211n as the number of pulse insertions to be set in the pulse insertion set register 148 shown in FIG. 9, and output them to the phase shift elements 70a to 70n.

Each of the phase shift elements 70a to 70n independently outputs the corresponding shift signal by shifting the phase of the reference signal 54 by the shift amount set by the corresponding shift amount set element. In the case where the phase shifting device 70 outputs a plurality of shift signals 72a to 72n having a predetermined resolution obtained by dividing the clock interval (period) of the reference signal 54 at a constant interval, the shift amount set elements 210a to 210n output the shift amount set signals 211a to 211n based on the resolution, respectively. Alternatively, in a case where a delay signal generating device 100 is used in the semiconductor test apparatus 40 (FIG. 4), it was found in advance that it was necessary to delay the input pattern signal 52 by a specific time period. Thus, in this case, the shift amount set elements 210a to 210n may set the required shift amounts only.

The shift signals 72a to 72n are input to the multiplexer 212. The selection control signal supply portion 90 supplies the selection control signal 92 to the multiplexer 212. In the case where the delay signal generating apparatus 100 is used in the semiconductor test apparatus 40 (FIG. 5), the selection control signal supply portion 90 outputs the selection control signal 92 based on a time of supplying the input pattern signal 52 to the device 50 to be tested. The multiplexer 212 selects a specific shift signal based on the selection control signal 92 and outputs the selected shift signal 218.

The additional circuit 214 includes an inverter and a feedback circuit connected to an input terminal and an output terminal of the inverter. The additional circuit 214 can apply a voltage Vc approximately at the mid-point between the control voltages $V_{dd}$ and $V_{ss}$ ($V_{dd}$>$V_{ss}$) supplied to the driver 216. Since the driver 216 responds immediately when the potential of the signal input thereto crosses the mid-point voltage $V_c$, transmission of a high-speed signal can be performed easily by providing the additional circuit 214. The driver 216 outputs the delay signal 74 based on the output of the multiplexer 212.

In an alternative embodiment, the multiplexer 212 may include a plurality of transmission gates to which a plurality of shift signals 72a to 72n are input, respectively, and a summing portion for summing the outputs of the transmission gates on one point. For example, the transmission gate may be formed by an AND gate, and the summing portion may be formed by an OR gate. The number of transmission gates provided is at least the same as the number of shift signals. Moreover, an additional circuit may be provided with the summing portion, which applies the potential approximately at the mid-point between the control voltages $V_{dd}$ and $V_{ss}$ ($V_{dd}$>$V_{ss}$) supplied to the summing portion. The multiplexer 212 selects the shift signal having the phase shifted by a predetermined shift amount by making only one of the transmission gates conductive, based on the selection control signal 92, and outputs the selected shift signal 218.

Figure 17:
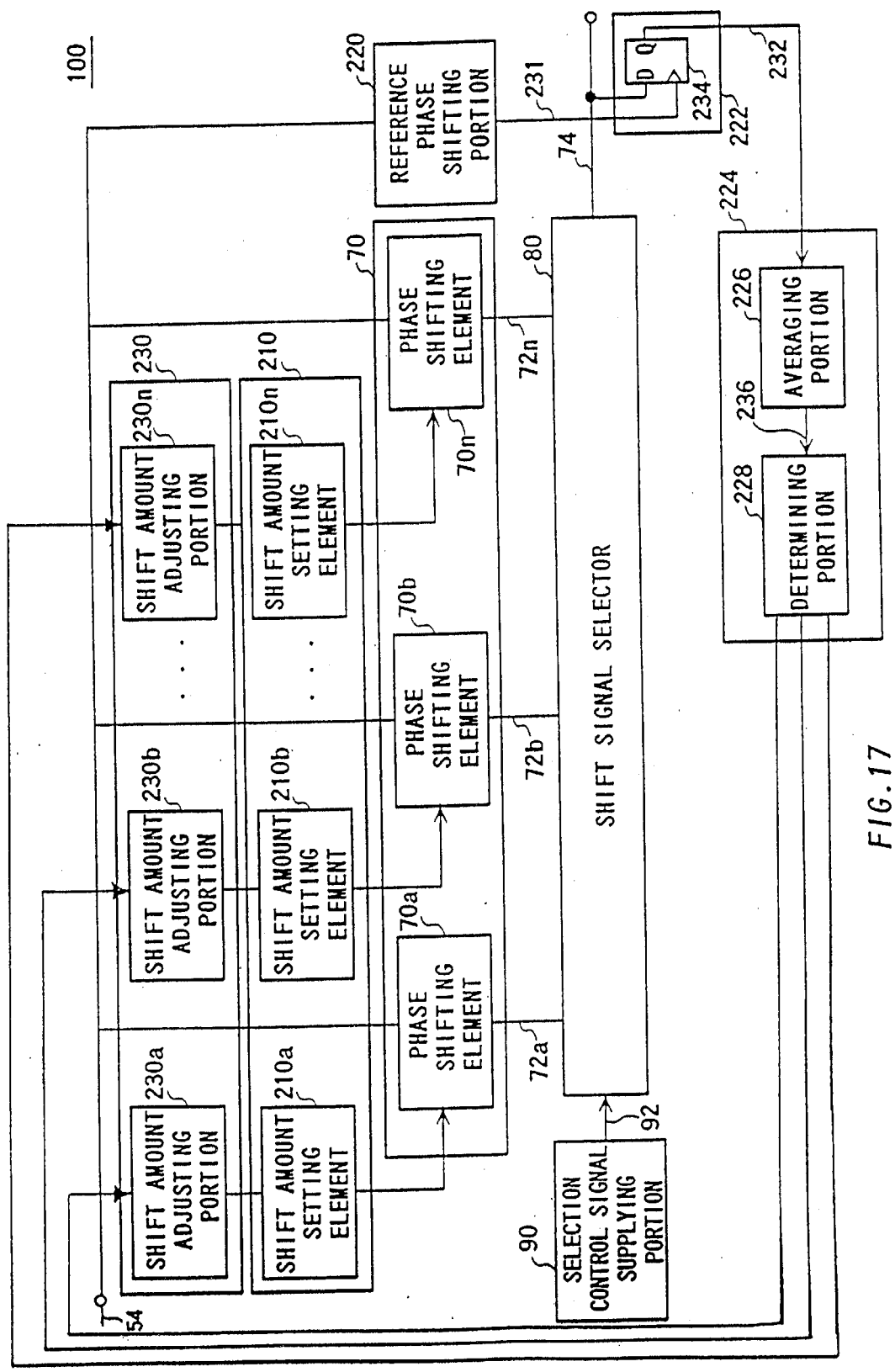
FIG. 17 is a block diagram showing a delay signal generating apparatus 100 that outputs the delay signal 74 obtained by delaying the reference signal 54, according to the third embodiment of the present invention.

FIG. 17 is a block diagram showing a delay signal generating apparatus 100 that outputs the delay signal 74 obtained by delaying the reference signal 54, according to the third embodiment of the present invention. The delay signal generating apparatus 100 includes the phase shifting device 70, the shift signal selector 80, the selection control signal supply portion 90, the shift amount setting device 210, a reference phase shift portion 220, a timing comparator 222, a measuring device 224 and a shift amount adjusting device 230. The phase shifting device 70 includes a plurality of phase shifting elements 70a, 70b, ..., 70n. The shift amount setting device 210 includes a plurality of shift amount setting elements 210a, 210b, ..., 210n. The shift amount adjusting device 230 includes a plurality of shift amount adjusting elements 230a, 230b, ..., 230n. The measuring device 224 includes an averaging portion 226 and a determining portion 228. The components with the same reference numerals as those in FIG. 6 have the same or similar functions to those of the corresponding components shown in FIG. 6. Each of the phase shifting elements 70a to 70n may have the same or similar structure as those shown in FIGS. 7 to 15. The shift signal selector 80 may have the same or similar structure to that shown in FIG. 16.

As described with reference to FIGS. 6 and 16, the delay signal generating apparatus 100 according to the present invention can generate a plurality of shift signals 72a to 72n having different shift amounts. In some cases however, when the shift signal is selected by the multiplexer in the shift signal selector 80, the output of the multiplexer varies slightly from a predetermined shift amount (delay time period) because of skew occurring in the respective selection inputs of the multiplexer. In order to avoid nonlinear error, the delay signal generating apparatus 100 in the third embodiment of the present invention includes the shift amount adjusting device 230, the reference phase shifting portion 220, the timing comparator 222 and the measuring device 224 in addition to the components shown in FIG. 16. The reference phase shifting portion 220 may have the same structure as that of the phase shifting elements 70a to 70n in the phase shifting device 70.

The reference phase shifting element 220 receives the reference signal 54 and outputs a reference delay signal 231 obtained by delaying the reference signal 54 by a predetermined time period. The reference delay signal 231 may have the same frequency as that of the reference signal 54. Alternatively, the reference delay signal 231 may have a frequency obtained by dividing the frequency of the reference signal 54. The selection control signal generator 90 outputs to the shift signal selector 80 the selection control signal 92 to allow selection of the shift signal obtained by shifting the reference signal 54 by a predetermined time period. The shift signal selector 80 selects a specific one of shift signals 72a to 72n based on the selection control signal 92, and outputs it as the delay signal 74.

The reference delay signal 231 and the delay signal 74 are input to the timing comparator 222. The timing comparator 222 compares timings of edges of the delay signal 74 and those of the reference delay signal 231. In this embodiment, the timing comparator 222 is a flip-flop 234 having a clock input to which the reference delay signal 231 is input, and a data input to which the delay signal 74 is input. In an alternative example, the reference delay signal 231 may be input to the data input, while the delay signal 74 may be input to the clock input. The timing comparator 222 outputs the comparison result 232 as the logical value "0" or "1". In this case, when the rising edge of the reference delay signal 231 is input to the flip-flop 234, the logical value of the delay signal 74 at this time is output from the flip-flop 234 as the comparison result 232.

The comparison result 232 is input to the measuring device 224. The measuring device 224 measures the delay time period of the delay signal 70 based on the comparison result 232. The measuring method is described in the following.

The comparison result 232 is input to the averaging portion 226 in the measuring device 224, where it is averaged with a predetermined period. For example, when the timing comparator 222 receives the rising edge of the reference delay signal 231 one hundred times, and then outputs the logical value "1" seventy times and the logical value "0" thirty times, the averaged logical value averaged by the averaging portion 226 is 0.7. The averaging portion 226 outputs the averaged value obtained by averaging the logical values output from the timing comparator 222 with a predetermined period. The average of the logical values is input to the determining portion 228 as the average result 236. The determining portion 228 determines, based on the average result 236, whether or not the delay time period of the delay signal 74 is equal to the delay time period of the reference delay signal 231.

The shift amount adjusting device 230 adjusts the shift amounts of the shift signals 72a to 72n output from the phase shifting elements 70a to 70n, respectively, based on the determination result of the determining portion 228. The shift amount adjusting device 230 includes a plurality of shift amount adjusting elements 230a to 230n for each of the phase shifting elements 70a to 70n, respectively. When the determining portion 228 determines that the delay time period of the delay signal 74 and that of the reference delay signal 231 are unequal, the corresponding shift amount adjusting element adjusts the shift amount of the shift signal output from the corresponding phase shifting element.

When the phase shifting elements 70a to 70n are pulse insertion type shift signal generators described with reference to FIGS. 7 to 15, the shift amount adjusting elements 230a to 230n may adjust the number of insertion pulses respectively set by the shift amount setting portion 210a to 210n. By increasing or decreasing the number of insertion pulses set by each of the shift amount set elements 210a to 210n, the phase shift amount of the corresponding shift signal can be adjusted.

The reference phase shift portion 220 successively outputs the reference delay signals 231 which are used as the reference for the shift signals 72a to 72n to be output from the respective phase shifting elements 70a to 70n. For example, in the case where the phase shifting device 70 outputs the shift signals 72a to 72n of k phase, obtained by delaying the reference signal 54 at a constant interval equal to a predetermined resolution, the reference phase shift portion 220 successively outputs the same reference delay signals 231 of k phase. The shift signals 72a to 72n are compared with the timing of edges of the respective reference delay signals 231 in the timing comparator 222, and then whether or not the phase shift amounts of the shift signals 72a to 72n are equal to the delay time periods of the respective reference delay signals 231 are determined in the determining portion 228. When the determination result is negative, the corresponding shift amount adjusting element 230a to 230n adjusts the shift amount.

In the delay signal generating apparatus 100 according to the third embodiment of the present invention, as shown in FIG. 17, the delay signal 74 output from the shift signal selector 80 has a precise predetermined delay time period. In other words, according to the third embodiment of the present invention, the nonlinear error caused by the skew occurring on the input side of the shift signal selector 80 is eliminated.

Figure 18:
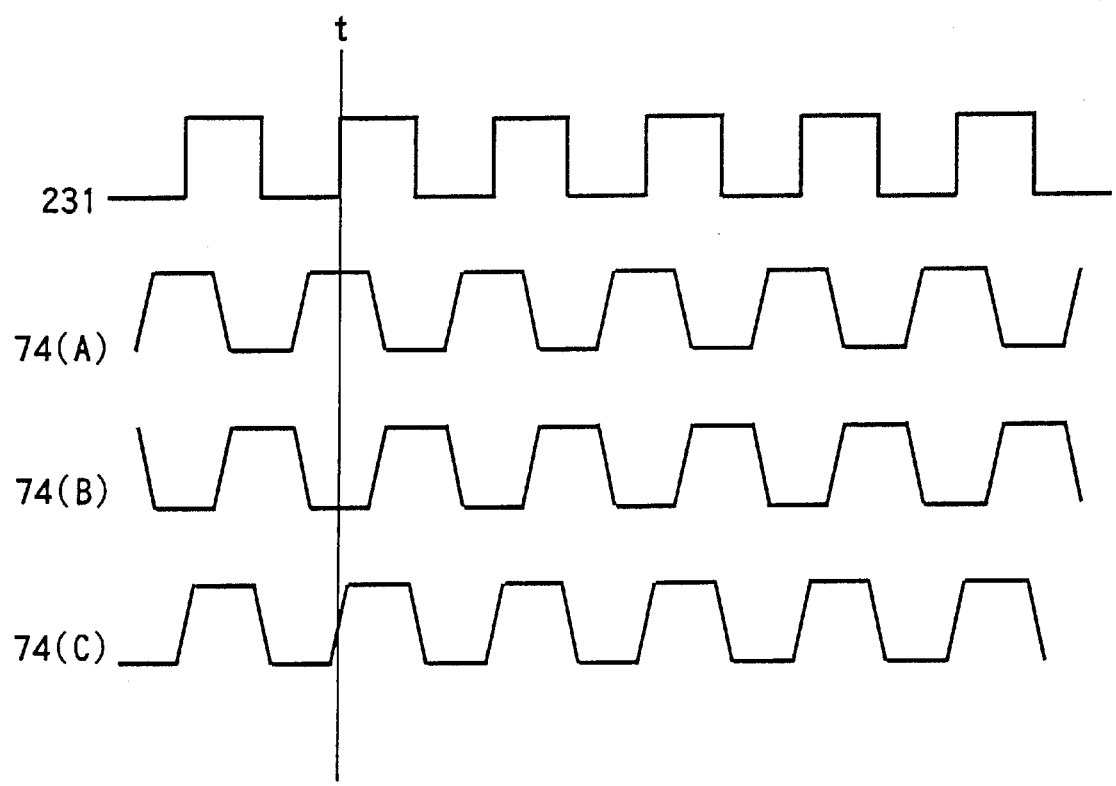
FIG. 18 is a chart showing timings of the reference delay signal 231, the delay signals 74(A), 74(B), and 74(C) that are input to the data input of the timing comparator 222.

FIG. 18 is a chart showing timings of the reference delay signal 231 and the delay signals 74(A), 74(B), and 74(C) that are input to the data input of the timing comparator 222. In this example, the reference delay signal 231 and the respective delay signals 74(A), 74(B) and 74(C) have the same period. The front edge of the reference delay signal 231 is input to the clock input of the timing comparator 222 at time t.

The delay signal 74(A) has the logical value "1" at time t. Since the reference delay signal 231 has the same period as the delay signal 74(A), the delay signal 74(A) always has the logical value "1" when the front edge of the reference delay signal 231 occurs, and thus the comparison result 232 in the timing comparator 222 always has the logical value "1". At this time, the average of the logical values averaged by the averaging portion 226 shown in FIG. 17 is "1". Although the reference delay signal 231 and the delay signal 74(A) have the same period in the third embodiment, the delay signal 74(A) always has the logical value "1" when the front edge of the reference delay signal 231 occurs, even in the case where the reference delay signal 231 has a period corresponding to a multiple of the period of the delay signal 74(A).

The delay signal 74(B) has the logical value "0" at the time t. Since the reference delay signal 231 and the delay signal 74(A) have the same period, as described above with respect to the delay signal 74(A), the delay signal 74(B) also has the logical value "0" at the time of occurrence of the next front edge of the reference delay signal 231. Thus, the delay signal 74(B) always has the logical value "0" when the front edge of the reference delay signal 231 occurs, so that the output of the timing comparator 222 always has the logical value "0". As a result, the average of the logical values averaged by the averaging portion 226 is "0".

The delay signal 74(C) has either one of logical values "0" or "1" at the time t. Since the front edge of the reference delay signal 231 is input to the timing comparator 222 between start and end times of the rise of the front edge of the delay signal 74(C), it is undetermined whether the comparison result 232 in the timing comparator 222 is "1" or "0". That is, the comparison result 232 is not fixed to "1" or "0". Therefore, the averaged value of the comparison result 232 in the timing comparator 222 has a value between 0 and 1. When the averaged value of the logical values averaged by the averaging portion 226 is a value between 0 and 1, the determining portion 228 determines that the delay time period of the reference delay signal 231 is approximately equal to that of a specific shift signal. In this case, it is preferable that the averaged value of the logical values output from the timing comparator 222 is in a range from 0.3 to 0.7, and more preferably the averaged value is approximately 0.5. During a predetermined time period, when the timing comparator 222 outputs the logical values "0" and "1" at the same time, the averaged value of the logical values output from the timing comparator 222 is 0.5. In this case, the determining portion 228 determines that the delay time period of a specific shift signal is equal to a predetermined delay time period of the reference delay signal 231.

As described above, when the delay signal 74(A) is input to the timing comparator 222, the averaged value of the logical values output from the timing comparator 222 is always "1", while the averaged value is always "0" when the delay signal 74(B) is input to the timing comparator 222. The fact that the averaged value is "1" or "0" indicates that the delay time period of the specific shift signal is not equal to a predetermined delay time period of the reference delay signal 231. In this case, the shift amount adjusting device 230 adjusts the shift amount of the shift signal in order for the averaged value in the timing comparator 222 to be a value between 0 and 1 (preferably 0.5).

As described with reference to FIGS. 17 and 18, the use of the delay signal generating apparatus 100 according to the third embodiment of the present invention enables high precision adjustment of the delay time period of the shift signal using the reference delay signal 231.

Figure 19:
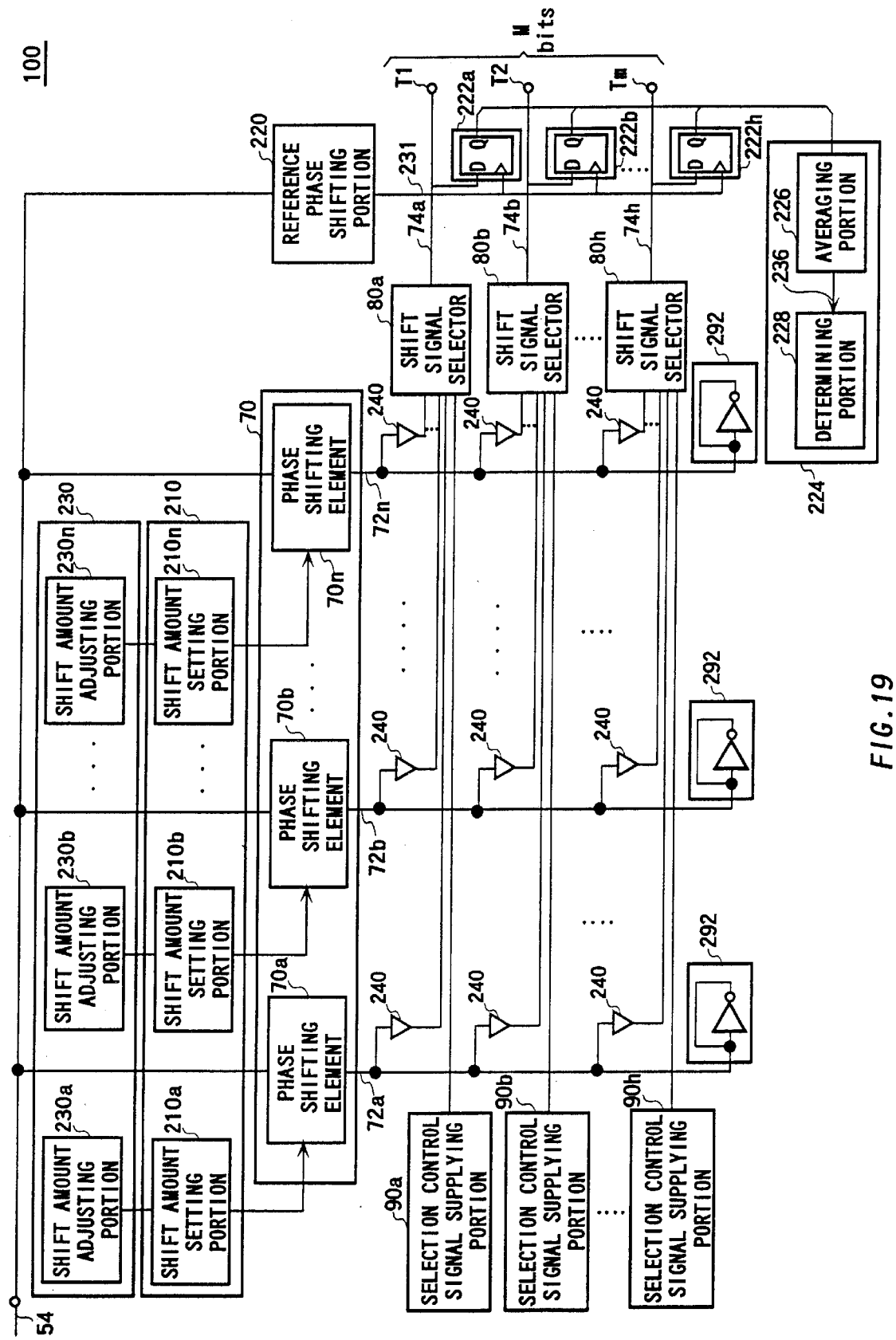
FIG. 19 is a block diagram of a delay signal generating apparatus 100 that outputs a plurality of (M-bit) delay signals 74a to 74h obtained by delaying the reference signal 54, according to the fourth embodiment of the present invention.

FIG. 19 is a block diagram of a delay signal generating apparatus 100 that outputs a plurality of (M-bit) delay signals 74a to 74h obtained by delaying the reference signal 54, according to the fourth embodiment of the present invention. The delay signal generating apparatus 100 includes the phase shifting device 70, a plurality of shift signal selectors 80a to 80h, a plurality of selection control signal supplying portions 90a to 90h, a shift amount setting device 210, the reference phase shifting element 220, a plurality of timing comparators 222a to 222h, the measuring device 224, the shift amount adjusting device 230, a plurality of drivers 240 and a plurality of additional circuits 292. The phase shifting device 70 includes a plurality of phase shifting elements 70a, 70b, . . . , 70n. The shift amount setting device 210 includes a plurality of shift amount setting elements 210a, 21b, . . . , 210n. The shift amount adjusting device 230 includes a plurality of shift amount adjusting elements 230a, 230b, . . . , 230n. The measuring device 224 includes the averaging portion 226 and the determining portion 228. It is preferable that all of the components of the delay signal generating apparatus 100 be formed on a single chip.

The components labeled with the same reference numerals as those in FIGS. 6, 16 and 17 have the same or similar functions to those of the corresponding components shown in FIGS. 6, 16 and 17, respectively. The phase shifting device 70 (70a to 70n) may have the same or similar structure to that shown in any of FIGS. 7 to 15.

In the fourth embodiment of the present invention, the shift signal selectors 80a to 80h select one of a plurality of shift signals 72a to 72n having shift amounts different from one another, and output a plurality of delay signals 74a to 74h having different delay time periods, respectively. When M-bit delay signals 74a to 74h are output from M output terminals T1 to Tm, it is preferable that M shift signal selectors are provided. In addition, in order to control the outputs of the shift signal selectors 80a to 80h, it is preferable to provide a selection control signal supplying portion for each of the shift signal selectors 80a to 80h. Moreover, it is preferable to arrange the driver 240 between each of the phase shifting elements 70a to 70n and the corresponding one of shift signal selectors 80a to 80n, in order to amplify the shift signal. Furthermore, in order to realize a high-speed operation, it is preferable to provide the additional circuit 292 that applies a voltage approximately at the mid-point between the two control voltages $V_{dd}$ and $V_{ss}$ ($V_{dd}$>$V_{ss}$) for each output of the phase shifting elements 70a to 70n.

The shift signal selectors 80a to 80n can be formed on a single chip. This enables the skews appearing on the input side of the shift signal selectors 80a to 80n to be substantially equal to each other. It is noted that the skews of the delay signals 74a to 74h can be made equal to each other by using the reference phase shifting element 220, the timing comparators 222a to 222h, the measuring device 224 and the shift amount adjusting device 230, as described with reference to FIG. 17.

In the case where the delay signal generating apparatus 100 is used for testing a semiconductor device, it is preferable that the number of shift signal selectors be equal to that of pins of the semiconductor device to be tested. Alternatively, the number of shift signal selectors provided may be equal to the number of types of signals included in the input pattern signal 52 to be input to the semiconductor device to be tested, such as a data signal, a control signal and an address signal. Since the signals having specific timing characteristics, such as the data signal or the control signal, are input to the semiconductor device, only the shift signal selectors that can output a timing signal (delay signal) having a timing required for the respective signal input to the semiconductor device to be tested may be provided.

Figure 20:
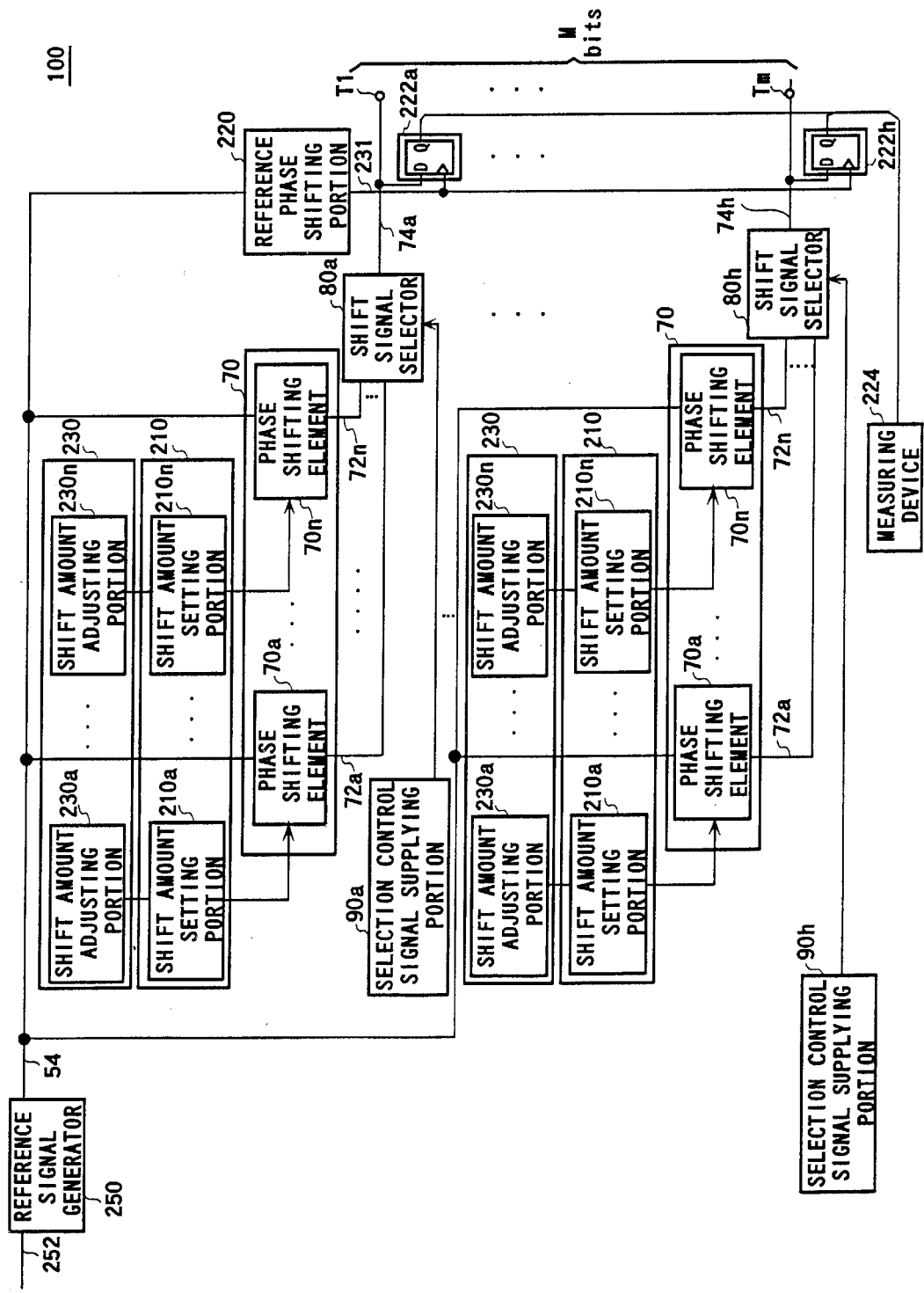
FIG. 20 is a block diagram of a delay signal generating apparatus 100 that outputs a plurality of (M-bit) delay signals 74a to 74h obtained by delaying the reference signal 54, according to the fifth embodiment of the present invention.

FIG. 20 is a block diagram of a delay signal generating apparatus 100 that outputs a plurality of (M-bit) delay signals 74a to 74h obtained by delaying the reference signal 54, according to the fifth embodiment of the present invention. The delay signal generating apparatus 100 includes a plurality of phase shifting devices 70, a plurality of shift signal selectors 80a to 80h, a plurality of selection control signal supplying portions 90a to 90h, a plurality of shift amount setting devices 210, the reference phase shifting element 220, a plurality of timing comparators 222a to 222h, the measuring device 224, a plurality of shift amount adjusting devices 230 and a reference signal generator 250. Each phase shifting device 70 includes a plurality of phase shifting elements 70a, 70b, . . . , 70n. The shift amount setting device 210 includes a plurality of shift amount setting elements 210a, 21b, . . . , 210n. Each shift amount adjusting device 230 includes a plurality of shift amount adjusting elements 230a, 230b, . . . , 230n. The main feature of the fifth embodiment is that the phase shifting device 70, the shift amount setting device 210, the shift amount adjusting device 230, the selection control signal supplying portion 90, the shift signal selector 80 and the timing comparator 222 are provided for each of output terminals T1 to Tm. It is preferable that all of the components of the delay signal generating apparatus 100 be formed on a single chip.

The components labeled with the same reference numerals as those in FIGS. 6, 16, 17 and 19 have the same or similar functions to those of the corresponding components in FIGS. 6, 16, 17 and 19, respectively. The phase shifting device 70 (70a to 70n) may have the same or similar structure to that shown in any of FIGS. 7 to 15.

The reference signal generator 250 can generate the reference signal 54 having a predetermined frequency, based on the input clock 252. For example, the reference signal generator 250 may be formed as a one-octave variable PLL oscillator that is a frequency source able to vary its frequency within a region of one octave (twice). The one-octave variable PLL oscillator can oscillate a reference signal 54 having a given period. Thus, the delay signal generating apparatus 100 can generate the delay signal 74 having a given period. Alternatively, the reference signal generator 250 may be replaced with a period generator that can generate a reference signal 54 having a predetermined period.

The shift signal selectors 80a to 80h can select one of a plurality of shift signals 72a to 72n having shift amounts different from one another, and outputs a plurality of delay signals 74a to 74h having different delay time periods, respectively. When M-bit delay signals 74a to 74h are output from the M output terminals T1 to Tm, it is preferable that the M shift signal selectors may be provided. In addition, in order to control the outputs of the shift signal selectors 80a to 80h, it is preferable to provide the selection control signal supplying portion for each of the shift signal selectors 80a to 80h.

In the case where the delay signal generating apparatus 100 is used for testing the semiconductor device, it is preferable that the number of shift signal selectors be equal to that of pins of the semiconductor device. Alternatively, the number of shift signal selectors provided may be equal to the number of types of signals included in the input pattern signal 52 to be input to the semiconductor device, such as a data signal, a control signal and an address signal.

A plurality of phase shifting devices 70 are provided for a plurality of shift signal selectors 80a to 80n, respectively. In order to set and adjust the shift amount in the phase shifting device 70, the shift amount setting device 210 and the shift amount adjusting device 230 are provided for each phase shifting device 70. The phase shifting devices 70 can output a plurality of shift signals 72a to 72n independently of each other. Each phase shifting device 70 may include the same number of phase shifting elements 70a to 70h as that included in other phase shifting devices 70. Alternatively, each phase shifting device 70 may include a different number of phase shifting elements from that included in other phase shifting devices. Similarly, each shift amount setting device 210 may include the same number of shift amount set elements 210a to 210n as that included in other shift amount setting devices 210 or may include a different number of shift amount setting portions from that in other shift amount setting devices 210. Similarly, each shift amount adjusting device 230 may include the same number of shift amount adjusting elements 230a to 230n as that in other shift amount adjusting devices 230. Alternatively, each shift amount adjusting device 230 may include a different number of shift a mount adjusting elements from that in other shift amount adjusting devices.

In the case of adjusting the delay time period of the shift signals 72a to 72n, every phase shifting device 70 can adjust the delay time period of the shift signals 72a to 72n based on the reference delay signal 231, because a shift amount adjusting device 230 is provided for each phase shift device 70.

As is apparent from the above description, according to the present invention, a delay signal generating apparatus that can generate a delay signal with high precision can be obtained. Although the present invention has been described by way of exemplary embodiments, it should be understood that many changes and substitutions may be made by those skilled in the art without departing from the spirit and the scope of the present invention which is defined only by the appended claims.

What is claimed is:

1. A delay signal generating apparatus for outputting a delay signal obtained by delaying a reference signal, comprising:

a phase shift device capable of outputting a plurality of shift signals having phases shifted from a phase of the reference signal by different shift amounts, respectively; and a shift signal selector capable of selecting one of said shift signals that has a phase shifted by a predetermined shift amount and outputting said delay signal which is delayed based on said selected shift signal.

2. A delay signal generating apparatus according to claim 1, wherein a plurality of shift signal selectors are provided that select one of said shift signals that have phases shifted by different shift amounts, respectively, and output a plurality of delay signals respectively having different delay time periods.

3. A delay signal generating apparatus according to claim 2, wherein said phase shift device is provided for each of said shift signal selectors.

4. A delay signal generating apparatus according to claim 1, wherein said phase shift device includes a plurality of phase shift elements that output a plurality of shift signals independently, by shifting said phase of said reference signal by different shift amounts, respectively.

5. A delay signal generating apparatus according to claim 4, further comprising a selection control signal supply portion capable of supplying to said shift signal selector a selection control signal for making said shift signal selector select one of said shift signals shifted by a predetermined amount.

6. A delay signal generating apparatus according to claim 5, further comprising a shift amount setting portion capable of setting said shift amounts of said shift signals output from said plurality of phase shift elements.

7. A delay signal generating apparatus according to claim 6, wherein said shift signal selector includes:

a multiplexer capable of selecting one of said shift signals shifted by said predetermined shift amount based on said selection control signal;

a driver capable of outputting said delay signal based on an output of said multiplexer; and an additional circuit capable of applying a voltage approximately at a mid-point between two power supply voltages $V_{dd}$ and $V_{ss}$ ($V_{dd}$>$V_{ss}$) supplied to said driver, to an output of said multiplexer.

8. A delay signal generating apparatus according to claim 6, wherein said shift signal selector includes:

a multiplexer having a plurality of transmission gates to which said plurality of shift signals are input and a summing portion which sums outputs of said transmission gates on a point; and an additional circuit capable of applying a voltage approximately at a mid-point between two power supply voltages $V_{dd}$ and $V_{ss}$ supplied to said summing portion, to said summing portion in said multiplexer, wherein said multiplexer selects one of said shift signals shifted by said predetermined shift amount by making one of said plurality of transmission gates conductive based on said selection control signal.

9. A delay signal generating apparatus according to claim 4, further comprising an additional circuit that applies a voltage approximately at a mid-point between two power supply voltages $V_{dd}$ and $V_{ss}$ ($V_{dd}$>$V_{ss}$) to respective outputs of said plurality of phase shifted elements.

10. A delay signal generating apparatus according to claim 1, further comprising:

a reference phase shift element capable of outputting a reference delay signal delayed from said reference signal by a predetermined time period;

a timing comparator capable of comparing timings of edges of said delay signal and edges of said reference delay signal and outputting a comparison result as a logical value "0" or a logical value "1"; and a measuring device capable of measuring a delay time period of said delay signal based on said comparison result made by said timing comparator.

11. A delay signal generating apparatus according to claim 10, wherein said measuring device includes:

an averaging portion capable of outputting an average value obtained by averaging said logical value, output from said timing comparator at a predetermined period; and a determining portion capable of determining based on said averaged value whether or not said delay time period of said delay signal is equal to said delay time period of said reference delay signal.

12. A delay signal generating apparatus according to claim 11, wherein said determining portion determines that said delay time period of said delay signal is equal to said delay time period of said reference delay signal when said averaged value of said logical value is 0.5.

13. A delay signal generating apparatus according to claim 11, further comprising a shift amount adjusting portion, provided for each of said phase shift elements, capable of adjusting said shift amounts of said shift signals output from said plurality of phase shift elements, based on determination result of said determining portion.

14. A delay signal generating apparatus according to claim 1, wherein said phase shift device includes:

an oscillator capable of oscillating an oscillation signal having a period the same as that of said reference signal;

a pulse insertion portion capable of generating an insertion pulse to be inserted to a referential oscillation signal having a front edge and a rear edge at least one of which is synchronized with a front edge or a rear edge of said oscillation signal, and inserting said generated insertion pulse into said referential oscillation signal; and a delay phase-locked portion capable of generating one of said shift signals obtained by shifting a phase of said oscillation signal oscillated by said oscillator from a phase of said reference signal by a predetermined shift amount, based on a referential reference signal synchronized with said reference signal and having the same period as that of said referential oscillation signal and said referential oscillation signal with said insertion pulse inserted thereinto.

15. A delay signal generating apparatus according to claim 14, wherein said phase shift device further includes a phase comparator capable of outputting said referential reference signal and said referential oscillation signal based on a phase difference between a synchronized oscillation signal synchronized with said oscillation signal and a synchronized reference signal synchronized with said reference signal and having the same period as that of said synchronized oscillation signal.

16. A semiconductor test apparatus for testing a target device, comprising:

a pattern generator capable of generating an input pattern signal to be input to said target device and an expected pattern signal to be output from said target device based on said input pattern signal, in synchronization with a reference signal;

a delay pattern signal generator capable of generating a delay pattern signal delayed from said input pattern signal from a phase of said reference signal by a predetermined time period, depending on input characteristics of said target device; and a comparator capable of comparing an output pattern signal output from said target device based on said delay pattern signal, with said expected pattern signal, wherein said delay pattern signal generator includes:

a phase shift device capable of outputting a plurality of shift signals having phases shifted from said phase of said reference signal by different shift amounts, respectively;

a shift signal selector capable of selecting one of said shift signals shifted by a predetermined shift amount and outputting a delay signal obtained by delaying said reference signal; and a delay pattern signal outputting portion capable of outputting said delay pattern signal delayed from said input pattern signal by said predetermined time period, based on said delay signal.

* * * * *